(12) United States Patent
Chang et al.

(10) Patent No.: US 11,043,489 B2
(45) Date of Patent: Jun. 22, 2021

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chia-Wen Chang, Taipei (TW); Hong-Nien Lin, Hsinchu (TW); Chien-Hsing Lee, Hsinchu (TW); Chih-Sheng Chang, Hsinchu (TW); Ling-Yen Yeh, Hsinchu (TW); Wilman Tsai, Saratoga, CA (US); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/049,172

(22) Filed: Jul. 30, 2018

(65) Prior Publication Data

US 2018/0350800 A1 Dec. 6, 2018

Related U.S. Application Data

(62) Division of application No. 15/476,221, filed on Mar. 31, 2017.

(Continued)

(51) Int. Cl.
*H01L 21/02* (2006.01)
*H01L 27/06* (2006.01)
(Continued)

(52) U.S. Cl.
CPC .... *H01L 27/0629* (2013.01); *H01L 21/82345* (2013.01); *H01L 21/823431* (2013.01);
(Continued)

(58) Field of Classification Search
CPC ......... H01L 27/11502; H01L 27/11507; H01L 27/11585; H01L 29/516; H01L 29/6684;
(Continued)

(56) References Cited

U.S. PATENT DOCUMENTS 5,384,729 A 1/1995 Sameshima
5,416,735 A 5/1995 Onishi et al.
(Continued)

FOREIGN PATENT DOCUMENTS

WO 2015164141 A1 10/2015

OTHER PUBLICATIONS

U.S. Non-Final Office Action dated Feb. 2, 2018 issued in U.S. Appl. No. 15/476,221.
Asif I. Khan et al., "Ferroelectric Negative Capacitance MOSFET: Capacitance Tuning & Antiferroelectric Operation", Department of Electrical Engineering & Computer Science, University of California, Berkeley CA, 2011, pp. 11.3.1-11.3-4.
(Continued)

*Primary Examiner* — Jay C Kim
(74) *Attorney, Agent, or Firm* — McDermott Will & Emery LLP

(57) ABSTRACT

A semiconductor device includes a first channel region disposed over a substrate, and a first gate structure disposed over the first channel region. The first gate structure includes a gate dielectric layer disposed over the channel region, a lower conductive gate layer disposed over the gate dielectric layer, a ferroelectric material layer disposed over the lower conductive gate layer, and an upper conductive gate layer disposed over the ferroelectric material layer. The ferroelectric material layer is in direct contact with the gate dielectric layer and the lower gate conductive layer, and has a U-shape cross section.

20 Claims, 31 Drawing Sheets

Related U.S. Application Data

(60) Provisional application No. 62/427,638, filed on Nov. 29, 2016.

(51) Int. Cl.

| | | |
|---|---|---|
| *H01L 27/1159* | (2017.01) | |
| *H01L 29/417* | (2006.01) | |
| *H01L 27/088* | (2006.01) | |
| *H01L 21/28* | (2006.01) | |
| *H01L 29/78* | (2006.01) | |
| *H01L 29/423* | (2006.01) | |
| *H01L 29/49* | (2006.01) | |
| *H01L 29/51* | (2006.01) | |
| *H01L 29/66* | (2006.01) | |
| *H01L 21/8234* | (2006.01) | |
| *H01L 49/02* | (2006.01) | |

(52) U.S. Cl.
CPC .. *H01L 21/823456* (2013.01); *H01L 27/0886* (2013.01); *H01L 27/1159* (2013.01); *H01L 28/40* (2013.01); *H01L 29/40111* (2019.08); *H01L 29/41791* (2013.01); *H01L 29/42376* (2013.01); *H01L 29/4958* (2013.01); *H01L 29/4966* (2013.01); *H01L 29/4975* (2013.01); *H01L 29/516* (2013.01); *H01L 29/517* (2013.01); *H01L 29/6684* (2013.01); *H01L 29/66795* (2013.01); *H01L 29/7851* (2013.01); *H01L 29/78391* (2014.09); *H01L 29/66545* (2013.01)

(58) Field of Classification Search
CPC ....... H01L 29/78391; H01L 21/823431; H01L 21/82345; H01L 21/823456; H01L 27/0629; H01L 28/40
USPC .......................................................... 257/295
See application file for complete search history.

(56) References Cited

U.S. PATENT DOCUMENTS

| | | | |
|---|---|---|---|
| 5,477,071 A | 12/1995 | Hamamoto et al. | |
| 5,516,710 A | 5/1996 | Boyd et al. | |
| 5,580,814 A | 12/1996 | Larson | |
| 5,777,356 A | 7/1998 | Dhote et al. | |
| 5,907,762 A | 5/1999 | Evans et al. | |
| 5,932,904 A | 8/1999 | Hsu et al. | |
| 5,940,705 A | 8/1999 | Lee et al. | |
| 6,075,264 A | 6/2000 | Koo | |
| 6,194,752 B1 | 2/2001 | Ogasahara et al. | |
| 6,262,451 B1 | 7/2001 | Huang et al. | |
| 6,278,152 B1 | 8/2001 | Hieda et al. | |
| 6,288,431 B1 | 9/2001 | Iwasa et al. | |
| 6,346,741 B1 | 2/2002 | Van Buskirk et al. | |
| 6,472,124 B1 | 10/2002 | Chung | |
| 6,566,148 B2 | 5/2003 | Hsu et al. | |
| 6,586,793 B2 | 7/2003 | Imai et al. | |
| 6,642,539 B2 | 11/2003 | Ramesh et al. | |
| 6,642,563 B2* | 11/2003 | Kanaya | H01L 21/76801 |
| | | | 257/296 |
| 6,673,664 B2 | 1/2004 | Hsu et al. | |
| 6,744,087 B2 | 6/2004 | Misewich et al. | |
| 6,951,825 B2 | 10/2005 | Li et al. | |
| 7,329,580 B2* | 2/2008 | Choi | H01L 21/84 |
| | | | 257/E21.682 |
| 7,374,953 B2 | 5/2008 | Lee | |
| 7,420,237 B2 | 9/2008 | Nagano et al. | |
| 7,462,538 B2* | 12/2008 | Li | H01L 21/823821 |
| | | | 257/274 |
| 7,491,631 B2 | 2/2009 | Furukawa et al. | |
| 7,518,189 B1 | 4/2009 | Hackler, Sr. et al. | |
| 7,651,935 B2* | 1/2010 | Adetutu | H01L 21/28088 |
| | | | 257/E21.101 |
| 7,659,157 B2* | 2/2010 | Greene | H01L 21/823807 |
| | | | 257/E21.242 |
| 7,821,014 B2 | 10/2010 | Yonezawa et al. | |
| 7,842,990 B2 | 11/2010 | Kang | |
| 7,910,967 B2 | 3/2011 | Shin et al. | |
| 7,915,112 B2 | 3/2011 | Xu et al. | |
| 8,154,089 B2 | 4/2012 | Ohguro | |
| 8,216,902 B2* | 7/2012 | Chang | B82Y 10/00 |
| | | | 257/E21.645 |
| 8,232,188 B2* | 7/2012 | Beyer | H01L 29/42376 |
| | | | 257/E21.409 |
| 8,304,823 B2* | 11/2012 | Boescke | G11C 11/22 |
| | | | 257/295 |
| 8,367,495 B2* | 2/2013 | Beyer | H01L 21/28088 |
| | | | 257/E21.611 |
| 8,518,781 B2 | 8/2013 | Fumitake | |
| 8,722,472 B2* | 5/2014 | Chang | B82Y 10/00 |
| | | | 257/E21.19 |
| 8,765,533 B2* | 7/2014 | Hsieh | H01L 29/66545 |
| | | | 257/288 |
| 8,796,085 B2 | 8/2014 | Koldiaev et al. | |
| 8,871,583 B2 | 10/2014 | Fumitake | |
| 9,012,975 B2* | 4/2015 | Chen | H01L 29/66795 |
| | | | 257/324 |
| 9,059,164 B2* | 6/2015 | Cheng | H01L 29/511 |
| 9,087,886 B2* | 7/2015 | Kim | H01L 21/02697 |
| 9,190,331 B2 | 11/2015 | Fumitake | |
| 9,196,542 B2* | 11/2015 | Wang | H01L 21/823468 |
| 9,263,577 B2 | 2/2016 | Ramaswamy et al. | |
| 9,269,792 B2 | 2/2016 | Cheng et al. | |
| 9,293,373 B1 | 3/2016 | Cheng et al. | |
| 9,312,268 B2* | 4/2016 | Toh | H01L 27/11524 |
| 9,349,842 B2* | 5/2016 | Schloesser | H01L 29/516 |
| 9,412,822 B2* | 8/2016 | Cai | H01L 29/1054 |
| 9,449,972 B1 | 9/2016 | Flachowsky et al. | |
| 9,490,335 B1 | 11/2016 | Doris et al. | |
| 9,558,804 B2 | 1/2017 | Muller | |
| 9,570,588 B2 | 2/2017 | Akarvardar et al. | |
| 9,576,801 B2 | 2/2017 | Li et al. | |
| 9,590,104 B2 | 3/2017 | Liaw | |
| 9,608,111 B2 | 3/2017 | Ramaswamy | |
| 9,653,394 B2 | 5/2017 | Lau et al. | |
| 9,653,602 B1 | 5/2017 | Cheng et al. | |
| 9,679,893 B2 | 6/2017 | Yan et al. | |
| 9,685,560 B2 | 6/2017 | Yamazaki et al. | |
| 9,722,043 B2 | 8/2017 | Basker et al. | |
| 9,722,093 B1 | 8/2017 | Xing et al. | |
| 9,735,287 B2* | 8/2017 | Zhu | H01L 29/66795 |
| 9,748,239 B2 | 8/2017 | Cheng et al. | |
| 9,768,181 B2* | 9/2017 | Chavan | H01L 27/11507 |
| 9,818,468 B2 | 11/2017 | Muller | |
| 9,818,875 B1 | 11/2017 | Bi et al. | |
| 9,837,546 B2 | 12/2017 | Yamazaki et al. | |
| 9,843,007 B2 | 12/2017 | Chang | |
| 9,847,109 B2 | 12/2017 | Van Houdt | |
| 9,853,211 B2 | 12/2017 | Sills et al. | |
| 9,865,608 B2 | 1/2018 | Mueller et al. | |
| 9,893,064 B2 | 2/2018 | Chung | |
| 9,966,473 B2 | 5/2018 | Endo | |
| 9,972,541 B2* | 5/2018 | Steigerwald | H01L 29/66795 |
| 10,050,143 B2* | 8/2018 | Ando | H01L 27/11507 |
| 10,411,113 B2* | 9/2019 | Wu | H01L 29/66553 |
| 10,615,265 B2 | 4/2020 | Ghani et al. | |
| 2006/0071255 A1 | 4/2006 | Chen et al. | |
| 2009/0206405 A1* | 8/2009 | Doyle | H01L 29/517 |
| | | | 257/365 |
| 2010/0110753 A1 | 5/2010 | Slesazeck et al. | |
| 2012/0175696 A1 | 7/2012 | Franzon et al. | |
| 2016/0035856 A1 | 2/2016 | van Bentum et al. | |
| 2016/0071947 A1 | 3/2016 | Wiatr et al. | |
| 2016/0099354 A1 | 4/2016 | Ramaswamy | |
| 2016/0181384 A1 | 6/2016 | Liu et al. | |
| 2016/0336312 A1 | 11/2016 | Yan et al. | |
| 2016/0336319 A1* | 11/2016 | Yang | H01L 29/66795 |
| 2016/0343827 A1 | 11/2016 | Wu et al. | |

(56) References Cited

U.S. PATENT DOCUMENTS

2018/0053830 A1     2/2018   Cheng
2018/0076334 A1     3/2018   Ando et al.

OTHER PUBLICATIONS

Chenming Hu et al., "0.2V Adiabatic NC-FinFET with 0.6mA/μm ION and 0.1nA/μm IOFF", Dept. of EECS, University of California, Berkeley, CA, 2015, pp. 39-40.

Kai-Shin Li et al., "Sub-60mV-Swing Negative-Capacitance FinFET without Hysteresis", National Taiwan University, Taipei, Taiwan, 4 pgs.

Cheng-I Lin et al., "Effects of the Variation of Ferroelectric Properties on Negative Capacitance FET Characteristics", IEEE Transactions on Electron Devices, pp. 1-3.

Non-final Office Action issued in related U.S. Appl. No. 15/476,221, dated May 9, 2019.

Final Office Action issued in U.S. Appl. No. 15/476,221, dated Aug. 24, 2018.

Advisory Action issued in U.S. Appl. No. 15/476,221, dated Nov. 9, 2018.

Final Office Action issued in U.S. Appl. No. 15/476,221, dated Aug. 22, 2019.

Advisory Action issued in U.S. Appl. No. 15/476,221, dated Sep. 27, 2019.

Non-Final Office Action issued in U.S. Appl. No. 15/476,221, dated May 21, 2020.

\* cited by examiner

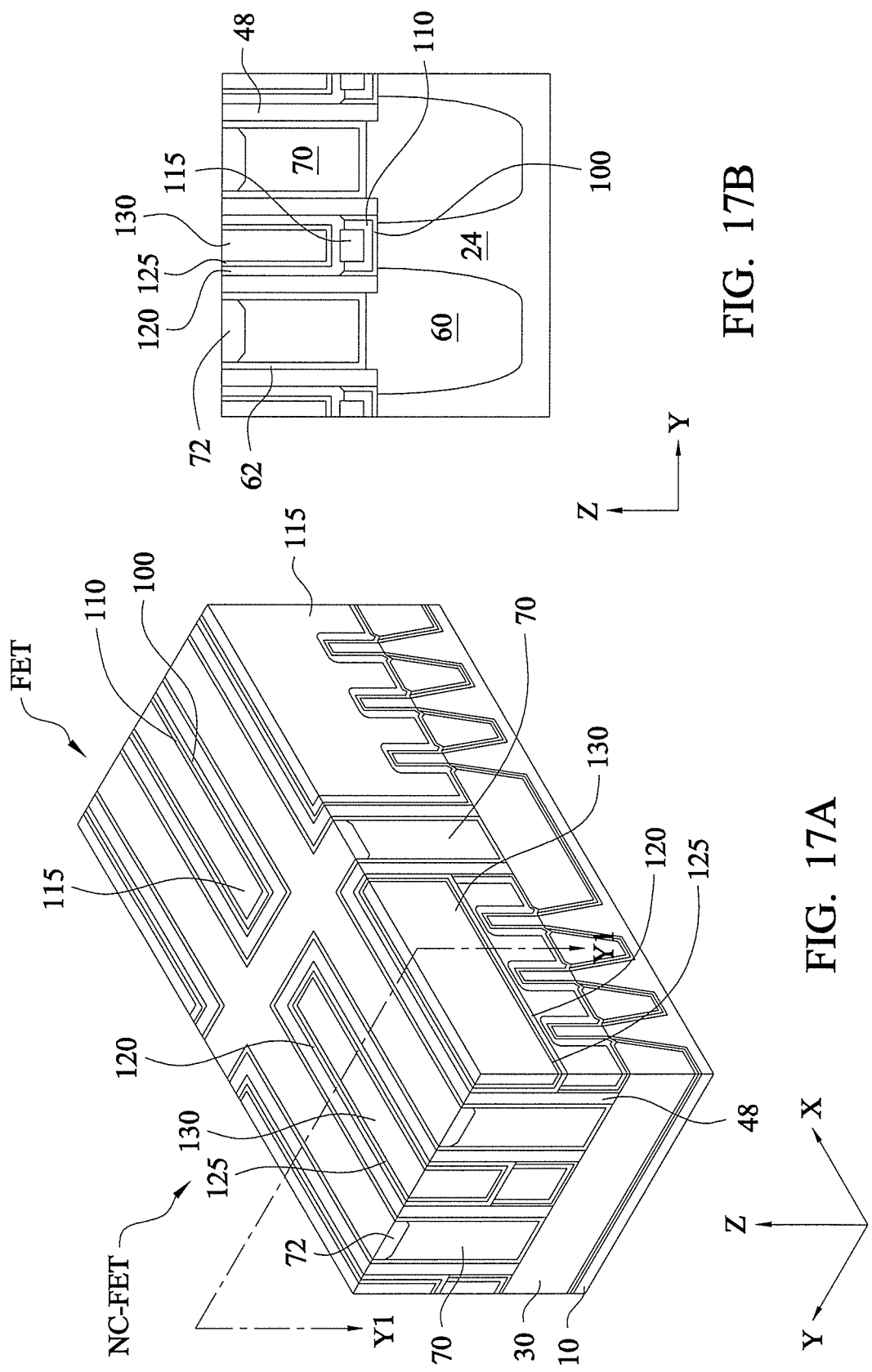

SEMICONDUCTOR DEVICE AND MANUFACTURING METHOD THEREOF

CROSS-REFERENCE TO RELATED APPLICATIONS

This application is a Divisional of U.S. patent application Ser. No. 15/476,221 filed Mar. 31, 2017, which claims priority to U.S. Provisional Patent Application 62/427,638 filed Nov. 29, 2016, the entire disclosure of which is incorporated herein by reference.

TECHNICAL FIELD

The disclosure relates to methods of manufacturing semiconductor integrated circuits, and more particularly to methods of manufacturing semiconductor devices including negative capacitance field effect transistors (NC-FETs), and semiconductor devices.

BACKGROUND

The subthreshold swing is a feature of a transistor's current-voltage characteristic. In the subthreshold region the drain current behavior is similar to the exponentially increasing current of a forward biased diode. A plot of logarithmic drain current versus gate voltage with drain, source, and bulk voltages fixed will exhibit approximately logarithmic linear behavior in this metal-oxide-semiconductor (MOS) FET operating region. To improve the subthreshold properties, a negative capacitance field effect transistor (NC-FET) using a ferroelectric material has been proposed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 17A shows an exemplary perspective view illustrating one of the various stages for manufacturing a semiconductor device according to some embodiments of the present disclosure. FIG. 17B shows an exemplary cross sectional view illustrating one of the various stages for manufacturing a semiconductor device according to some embodiments of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

The following embodiments disclose embedded ferroelectric metal-insulator-metal (MIM) capacitor structures for multiple threshold voltage negative-capacitance fin field effect transistors (NC-FinFETs) with subthreshold swing improvement, and a hybrid gate-last manufacturing method for integrating multiple threshold voltage NC-FinFETs and FinFETs in a single chip.

As the transistor size is scaled down, continuously scaling down of voltage (e.g., power supply) is rather important for ultra-low power devices. However, voltage scaling down will meet the bottleneck of physical limitation of subthreshold swing with 60 mV/decade, which is accompanied with a higher off-state leakage current. An NC-FET, which introduces a negative ferroelectric metal-insulator-metal (MIM) capacitor onto a gate electrode (internal gate) of MOSFET, will overcome the problem.

Figure 1:
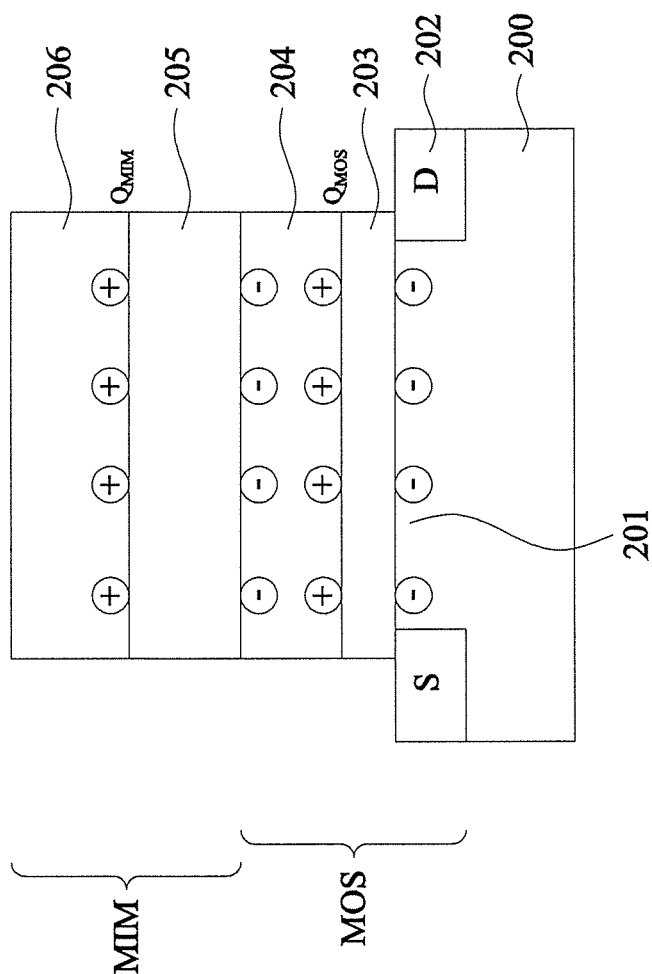
FIG. 1 illustrates an exemplary structure of an NC-FET in accordance with some embodiments of the present disclosure.

An exemplary structure of an NC-FET is shown in FIG. 1. An NC-FET includes a substrate 200, a channel 201 and source and drain 202. The source and drain 202 are appropriately doped with impurities. Further, the source and drain and the channel (active regions) are surrounded by an isolation insulating layer, such as shallow trench isolation (STI), made of, for example, silicon oxide.

A first gate dielectric layer 203 is disposed over the channel 201. The first gate dielectric layer 203 is made of oxide, such as silicon oxide, or silicon oxynitride in some embodiments. In other embodiments, the first gate dielectric layer 203 includes one or more high-k dielectric (oxide) layers (e.g., having a dielectric constant greater than 3.9).

A first gate electrode 204 as an internal electrode is disposed on the first gate dielectric layer 203. The first gate electrode 204 may be a metal selected from a group of W, Cu, Ti, Ag, Al, TiAl, TiAlN, TaC, TaCN, TaSiN, Mn, Co, Pd, Ni, Re, Ir, Ru, Pt, and Zr. In some embodiments, the first gate electrode 204 includes a metal selected from a group of TiN, WN, TaN, and Ru. Metal alloys such as Ti—Al, Ru—Ta, Ru—Zr, Pt—Ti, Co—Ni and Ni—Ta may be used and/or metal nitrides, such as $WN_x$, $TiN_x$, $MoN_x$, $TaN_x$, and $TaSi_xN_y$ may be used. In some embodiments, TiN is used as the first gate electrode 204.

A second gate dielectric layer 205, which is made of a ferroelectric material, is formed on the first gate electrode 204.

Further, a second gate electrode 206 as an external gate is disposed on the second gate dielectric layer 205. The second gate electrode 206 may be a metal selected from a group of W, Cu, Ti, Ag, Al, TiAl, TiAlN, TaC, TaCN, TaSiN, Mn, Co, Pd, Ni, Re, Ir, Ru, Pt, and Zr. The second gate electrode 206 is made of the same material as or different material from the first gate electrode 204.

The channel 201, the gate dielectric layer 203 and the first gate electrode 204 constitute a MOS (metal-oxide-semiconductor) structure and the first gate electrode 204, the ferroelectric layer 205 and the second gate electrode 206 constitute a MIM (metal-insulator-metal) structure.

The voltage across the ferroelectric MIM capacitor ($V_{FE}$) formed by the first gate electrode 204, the ferroelectric layer 205 and the second gate electrode 206 is calculated from the ferroelectric equation: $V_{FE} = (2\square Q + 4\square Q^3) * T_{FE}$, where $\square$ and $\square$ are anisotropy constant, Q is the surface charge density and $T_{FE}$ is the ferroelectric layer thickness. When imposing a voltage on the ferroelectric MIM capacitor, the internal gate (layer 204) voltage is amplified due to the induced negative voltage across the ferroelectric MIM capacitor, resulting in a sub-60 mV/decade subthreshold swing for an NC-FET. The transport physics of the intrinsic MOSFET is still kept unchanged even when connecting the ferroelectric MIM capacitor in series with the MOSFET. The dominant performance gain of an NC-FET is in the reduction of subthreshold swing, which provides the benefits of not only smaller voltage but also a lower off-state leakage current.

When an FET is formed by a gate-first process flow, the gate dielectric layer may degrade due to subsequent processes, including a high temperature thermal process, which causes uncontrolled threshold voltage, higher gate leakage current and insufficient reliability issues. In contrast, in a gate-last process flow, it is possible to achieve adjustable threshold voltage and better gate dielectric quality due to a low thermal budget.

However, in the gate-last process flow, as the dimensions of FETs, in particular fin field FETs (FinFETs) become further smaller, after a dummy gate removal, an aspect ratio of the gate space and fin spaces becomes higher, and then a conformal deposition of the ferroelectric layer and the external gate electrode becomes more difficult.

Further, a semiconductor device includes multiple threshold voltage (Vth) transistors, for example, an n-channel ultra-low threshold voltage (N-uLVT) FET, an n-channel standard threshold voltage (N-SVT) FET, a p-channel standard threshold voltage (P-SVT) FET and a p-channel ultra-low threshold voltage (P-uLVT) FET, which are fabricated with different work-function adjustment metal (WFM) thicknesses. After the deposition of WFM of different thicknesses on the gate spaces, different aspect ratios of the gate spaces are obtained, which makes the formation of the subsequent ferroelectric layer and the external gate electrode layer difficult.

For example, for a P-uLVT FET with the thinnest WFM, a conformal ferroelectric layer and the external gate electrode layer are formed on the top of the fin. However, for an N-uLVT FET, an N-SVT FET and a P-SVT FET with a thicker WFM, the ferroelectric layer can fully fill the gate space, and the external gate layer may not fill the gate space. In such a case, a relatively thicker thickness and smaller area of the ferroelectric layer is formed on the top of the fin. However, in some cases, the external gate electrode may not be formed in the gate space to form an MIM structure, because the gate space is filled with the ferroelectric layer.

In the circuit operation perspective, if regular FinFETs and NC-FinFETs coexist in one semiconductor device (chip), the circuit design will have more flexibility. For example, in the power gating technique, the standby power of the controlled logic-block can be reduced by connecting in series with large-area switching FinFETs. Generally, for switching transistors, if multiple threshold voltage NC-FinFETs are substituted for FinFETs, the area consumption and standby power of switching transistors can be greatly reduced, while the logic-block can still keep the same circuit function with FinFET structures.

In the following embodiments, methods and structures for integrating FinFETs and NC-FinFETs in a single chip will be described.

FIGS. 2-19B show exemplary views of various stages for manufacturing FinFETs and NC FinFETs according to some embodiments of the present disclosure. It is understood that additional operations can be provided before, during, and after processes shown by FIGS. 2-19B, and some of the operations described below can be replaced or eliminated, for additional embodiments of the method. The order of the operations/processes may be interchangeable.

In the present disclosure, the gate-last process is employed, and the operations shown by FIGS. 2-14 are the same for the regular FinFETs and the NC-FinFETs.

A mask layer 15 is formed over a substrate 10. The mask layer 15 is formed by, for example, a thermal oxidation process and/or a chemical vapor deposition (CVD) process.

In some embodiments, the substrate 10 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn)), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 200 may include an epitaxial layer (epi-layer), which may be strained for performance enhancement, and/or may include a silicon-on-insulator (SOI) structure. When the substrate 10 is Si, the Si substrate is, for example, a p-type silicon or germanium substrate with an impurity concentration in a range from about $1\times10^{15}$ cm$^{-3}$ to about $1\times10^{16}$ cm$^{-3}$. In other embodiments, the substrate is an n-type silicon or germanium substrate with an impurity concentration in a range from about $1\times10^{15}$ cm$^{-3}$ to about $1\times10^{16}$ cm$^{-3}$.

The mask layer 15 includes, for example, a pad oxide (e.g., silicon oxide) layer 15A and a silicon nitride mask layer 15B in some embodiments.

The pad oxide layer 15A may be formed by using thermal oxidation or a CVD process. The silicon nitride mask layer 15B may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer 15A is in a range from about 2 nm to about 15 nm and the thickness of the silicon nitride mask layer 15B is in a range from about 2 nm to about 50 nm in some embodiments. A mask pattern is further formed over the mask layer. The mask pattern is, for example, a resist pattern formed by lithography operations.

Figure 2:
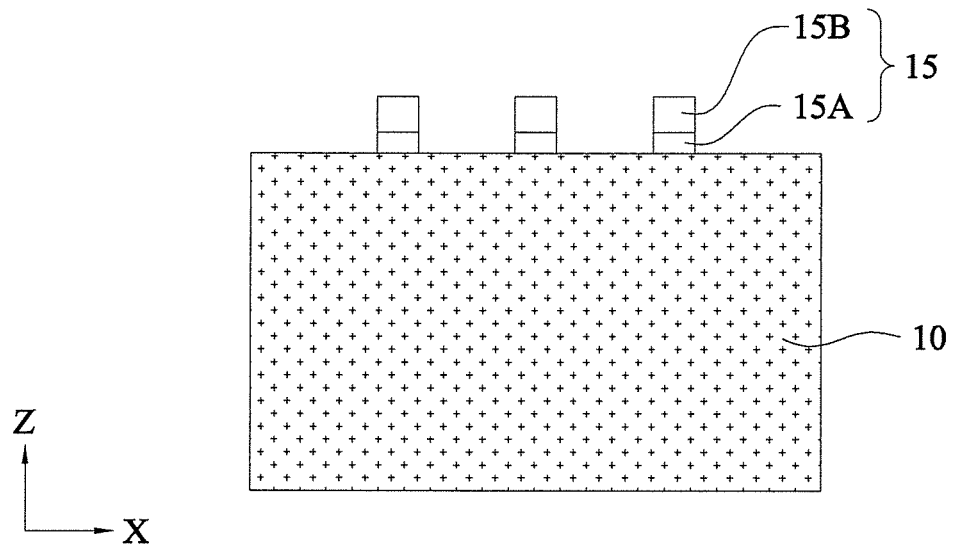
FIG. 2 shows an exemplary cross sectional view illustrating one of the various stages for manufacturing a semiconductor device according to some embodiments of the present disclosure.

By using the mask pattern as an etching mask, a hard mask pattern 15 of the pad oxide layer and the silicon nitride mask layer is formed, as shown in FIG. 2.

Figure 3:
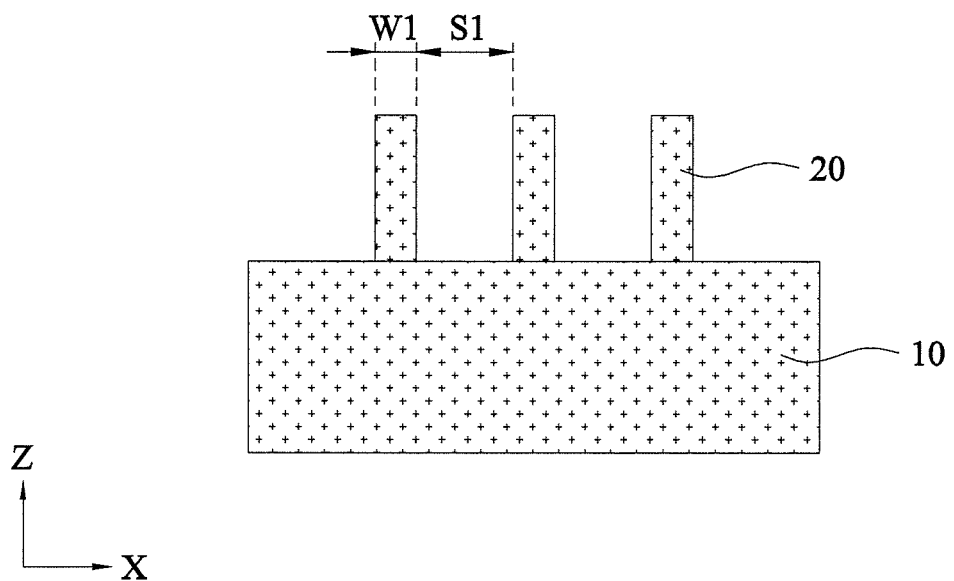
FIG. 3 shows an exemplary cross sectional view illustrating one of the various stages for manufacturing a semiconductor device according to some embodiments of the present disclosure.

Then, as shown in FIG. 3, by using the hard mask pattern 15 as an etching mask, the substrate 10 is patterned into fin structures 20 by trench etching using a dry etching method and/or a wet etching method.

In FIG. 3, three fin structures 20 are disposed over the substrate 10. However, the number of the fin structures is not limited to three. The numbers may be as small as one, or more than three. In addition, one or more dummy fin structures may be disposed adjacent both sides of the fin structure 20 to improve pattern fidelity in patterning processes.

The fin structure 20 may be made of the same material as the substrate 10 and may continuously extend from the substrate 10. In this embodiment, the fin structure is made of Si. The silicon layer of the fin structure 20 may be intrinsic, or appropriately doped with an n-type impurity or a p-type impurity.

The width W1 of the fin structure 20 is in a range from about 5 nm to about 40 nm in some embodiments, and is in a range from about 7 nm to about 12 nm in other embodiments. The space S1 between two fin structures is in a range from about 10 nm to about 50 nm in some embodiments. The height (along the Z direction) of the fin structure 20 is in a range from about 100 nm to about 300 nm in some embodiments, and is in a range from about 50 nm to 100 nm in other embodiments.

The lower part of the fin structure 20 under the gate structure 40 (see, FIG. 6A) may be referred to as a well region, and the upper part of the fin structure 20 may be referred to as a channel region. Under the gate structure 40, the well region is embedded in the isolation insulating layer 30 (see, FIG. 6A), and the channel region protrudes from the isolation insulating layer 30. A lower part of the channel region may also be embedded in the isolation insulating layer 30 to a depth of about 1 nm to about 5 nm.

The height of the well region is in a range from about 60 nm to 100 nm in some embodiments, and the height of the channel region is in a range from about 40 nm to 60 nm, and is in a range from about 38 nm to about 55 nm in other embodiments.

Figure 4:
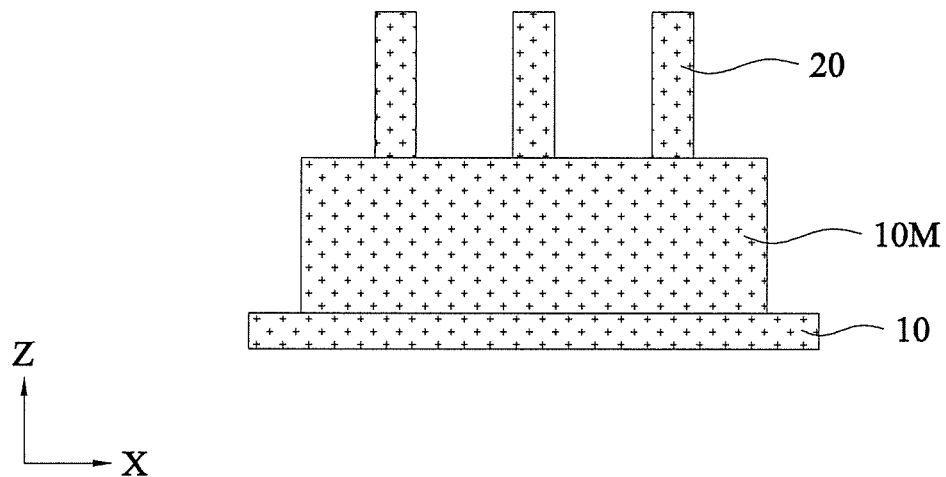
FIG. 4 shows an exemplary cross sectional view illustrating one of the various stages for manufacturing a semiconductor device according to some embodiments of the present disclosure.

After the fin structures 20 are formed, the substrate 10 is further etched to form a mesa shape 10M, as shown in FIG. 4. In other embodiments, the mesa shape 10M is first formed, and then the fin structures 20 are formed.

After the fin structures 20 and the mesa shape 10M are formed, the isolation insulating layer 30 is formed in spaces between the fin structures and/or a space between one fin structure and another element formed over the substrate 10. The isolation insulating layer 30 may also be called a "shallow-trench-isolation (STI)" layer. The insulating material for the isolation insulating layer 30 may include one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous.

Figure 5:
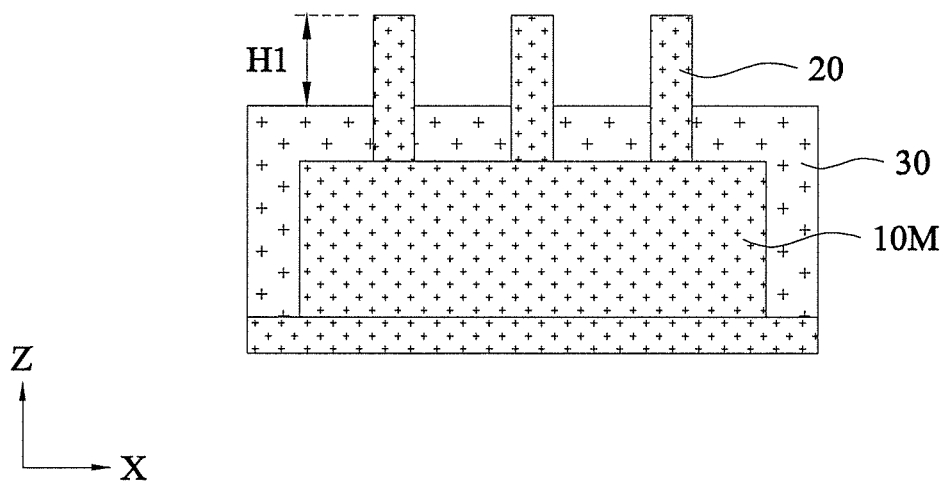
FIG. 5 shows an exemplary cross sectional view illustrating one of the various stages for manufacturing a semiconductor device according to some embodiments of the present disclosure.

The insulating layer 30 is first formed in a thick layer so that the fin structures are embedded in the thick layer, and the thick layer is recessed so as to expose the upper portions of the fin structures 20, as shown in FIG. 5. The height H1 of the fin structures from the upper surface of the isolation insulating layer 30 is in a range from about 20 nm to about 100 nm in some embodiments, and is in a range from about 30 nm to about 50 nm in other embodiments. After or before recessing the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar or He ambient.

Figure 6A:
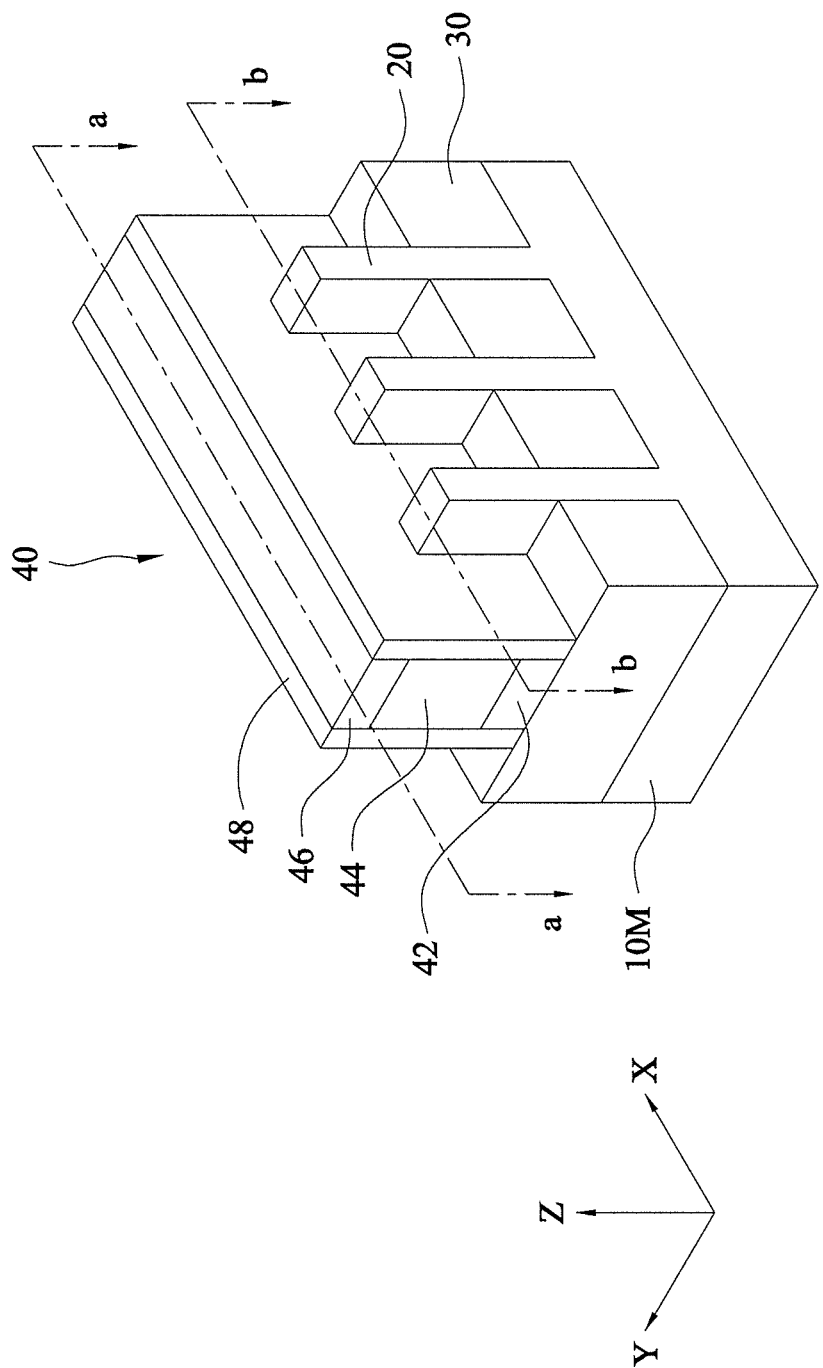
FIG. 6A shows an exemplary perspective view and FIGS. 6B and 6C are exemplary cross sectional views illustrating one of the various stages for manufacturing a semiconductor device according to some embodiments of the present disclosure.
Figure 6B:
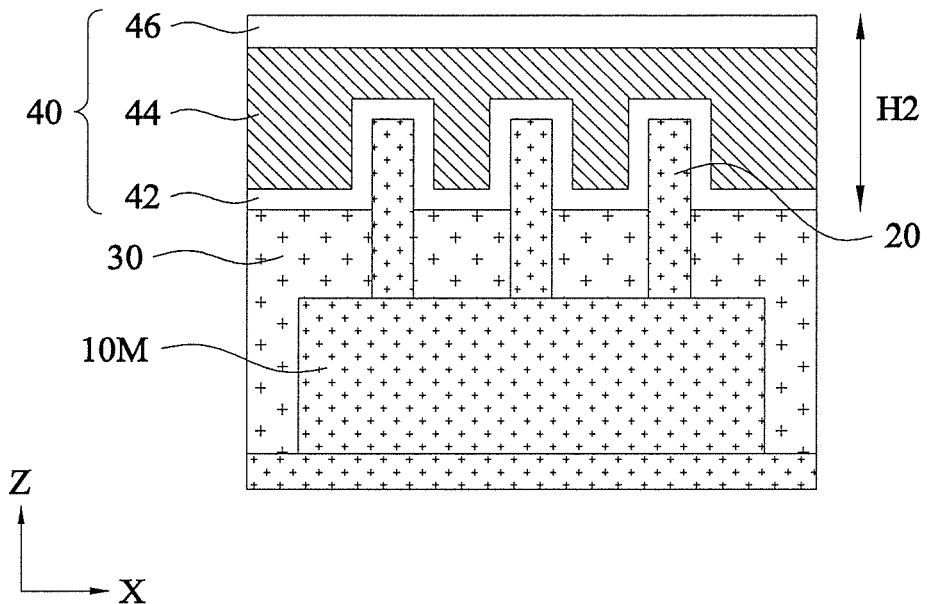
Figure 6C:
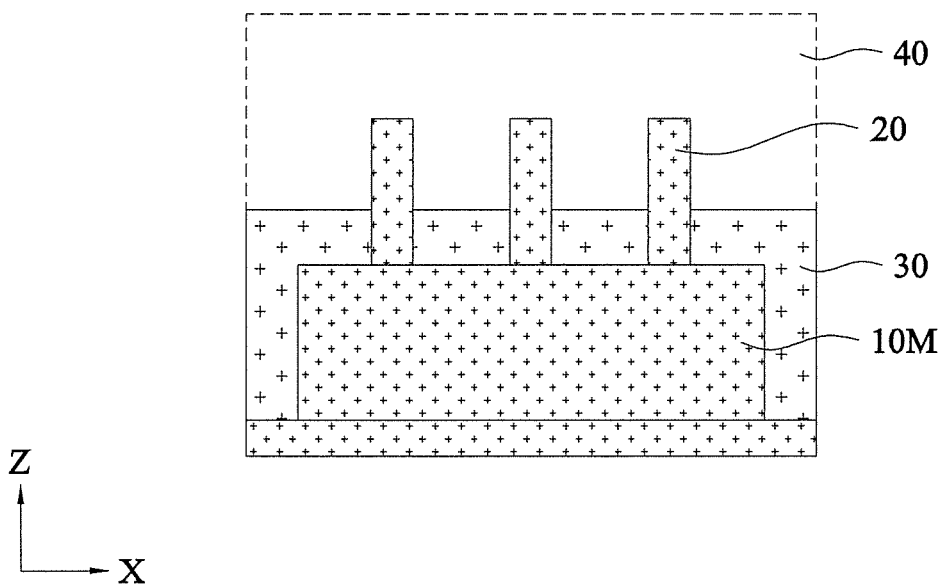

After the insulating layer 30 is formed, a gate structure 40 is formed over the fin structures 20, as shown in FIGS. 6A-6C. FIG. 6A is an exemplary perspective view, FIG. 6B is an exemplary cross sectional view along line a-a of FIG. 6A and FIG. 6C is an exemplary cross sectional view along line b-b of FIG. 6A.

As shown in FIG. 6A, the gate structure 40 extends in the X direction, while the fin structures 20 extend in the Y direction.

To fabricate the gate structure 40, a dielectric layer and a poly silicon layer are formed over the isolation insulating layer 30 and the exposed fin structures 20, and then patterning operations are performed so as to obtain gate structures including a gate pattern 44 made of poly silicon and a dielectric layer 42. In some embodiments, the polysilicon layer is patterned by using a hard mask and the hard mask remains on the gate pattern 44 as a cap insulating layer 46. The hard mask (cap insulating layer 46) includes one or more layers of insulating material. The cap insulating layer 46 includes a silicon nitride layer formed over a silicon oxide layer in some embodiments. In other embodiments, the cap insulating layer 46 includes a silicon oxide layer formed over a silicon nitride layer. The insulating material for the cap insulating layer 46 may be formed by CVD, PVD, ALD, e-beam evaporation, or other suitable process. In some embodiments, the dielectric layer 42 may include one or more layers of silicon oxide, silicon nitride, silicon oxy-nitride, or high-k dielectrics. In some embodiments, a thickness of the dielectric layer 42 is in a range from about 2 nm to about 20 nm, and in a range from about 2 nm to about 10 nm in other embodiments. The height H2 of the gate structures is in a range from about 50 nm to about 400 nm in some embodiments, and is in a range from about 100 nm to 200 nm in other embodiments.

In present embodiments, a gate replacement technology is employed, and the gate pattern 44 and the dielectric layer 42 are a dummy gate electrode and a dummy gate dielectric layer, respectively, which are subsequently removed. Thus, the gate structure 40 is a dummy gate structure.

Further, gate sidewall spacers 48 are formed on both sidewalls of the gate pattern. The sidewall spacers 48 include one or more layers of insulating material, such as $SiO_2$, SiN, SiON, SiOCN or SiCN or any other suitable dielectric material, which are formed by CVD, PVD, ALD, e-beam evaporation, or other suitable process. A low-k dielectric material may be used as the sidewall spacers. The sidewall spacers 48 are formed by forming a blanket layer of insulating material and performing anisotropic etching. In one embodiment, the sidewall spacer layers are made of silicon nitride based material, such as SiN, SiON, SiOCN or SiCN.

Figure 7:
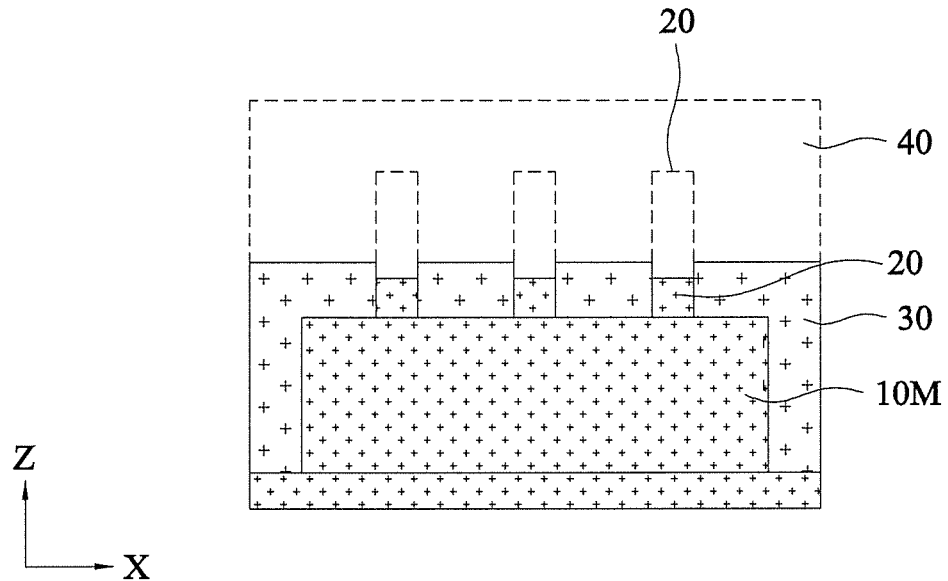
FIG. 7 shows an exemplary cross sectional view illustrating one of the various stages for manufacturing a semiconductor device according to some embodiments of the present disclosure.

Then, as shown in FIG. 7, the upper portion of the fin structures 20 are recessed by a dry etching and/or a wet etching operation. In some embodiments, the upper portion of the fin structures 20 are recessed (etched) down to the level equal to or below the upper surface isolation insulating layer 30.

Figure 8:
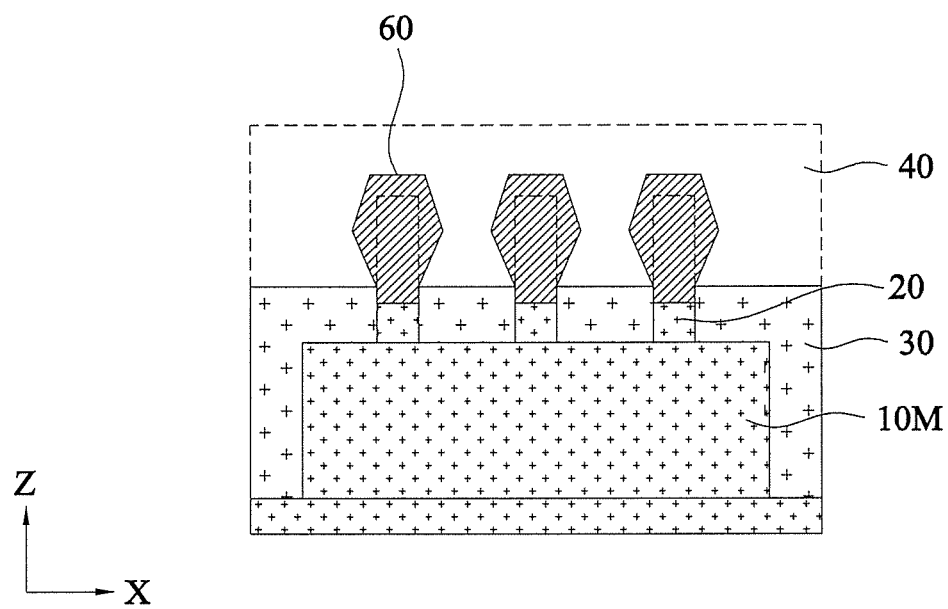
FIG. 8 shows an exemplary cross sectional view illustrating one of the various stages for manufacturing a semiconductor device according to some embodiments of the present disclosure.

Then, as shown in FIG. 8, an epitaxial source/drain structure 60 is formed over the recessed fin structures 20. The epitaxial source/drain structure 60 is made of one or more layers of semiconductor material having a different lattice constant than the fin structures 20 (channel regions). When the fin structures are made of Si, the epitaxial source/drain structure 60 includes SiP, SiC or SiCP for an n-channel Fin FET and SiGe or Ge for a p-channel Fin FET. The epitaxial source/drain structure 60 is epitaxially formed over the upper portions of the recessed fin structures. Due to the crystal orientation of the substrate faulted into the fin structures 20, the epitaxial source/drain structure 60 grows laterally and has a hexagonal shape. In other embodiments, a diamond-like shape is obtained.

The source/drain epitaxial layer 60 may be grown at a temperature of about 600 to 800° C. under a pressure of about 80 to 150 Torr, by using a Si containing gas such as $SiH_4$, $Si_2H_6$ or $SiCl_2H_2$, a Ge containing gas, such as $GeH_4$, $Ge_2H_6$ or $GeCl_2H_2$, a C containing gas, such as $CH_4$ or $C_2H_6$, and/or a dopant gas, such as $PH_3$. The source/drain structure for an n-channel FET and the source/drain structure for a p-channel FET may be formed by separate epitaxial processes.

In some embodiments, the source/drain epitaxial layers 60 are separately formed on respective recessed fin structures 20. In other embodiments, the adjacent epitaxial source/drain structures formed over each of the recessed fin structures 20 are merged. In such a case, a void or a gap (an air gap) may be formed between the merged epitaxial source/drain structure 60 the upper surface of the isolation insulating layer 30.

Figure 9A:
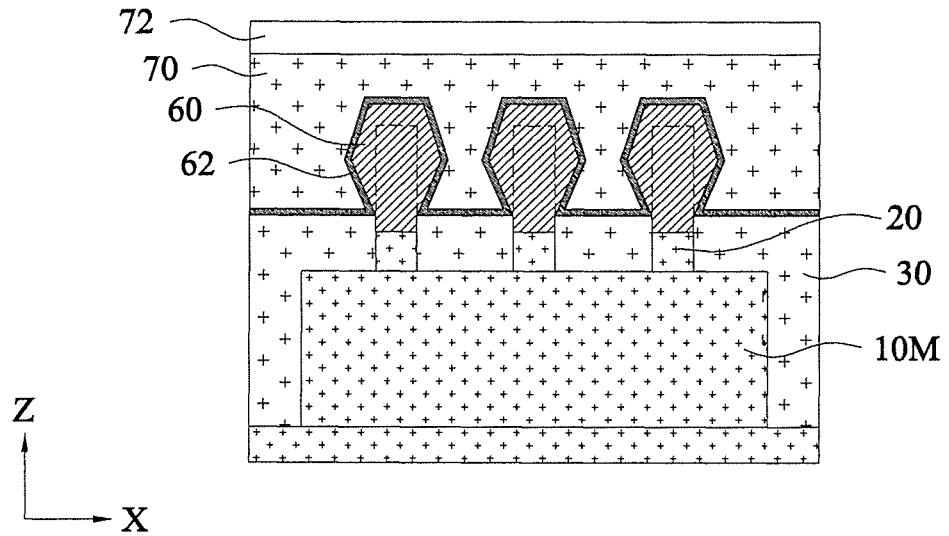
FIGS. 9A and 9B show exemplary cross sectional views illustrating one of the various stages for manufacturing a semiconductor device according to some embodiments of the present disclosure.
Figure 9B:
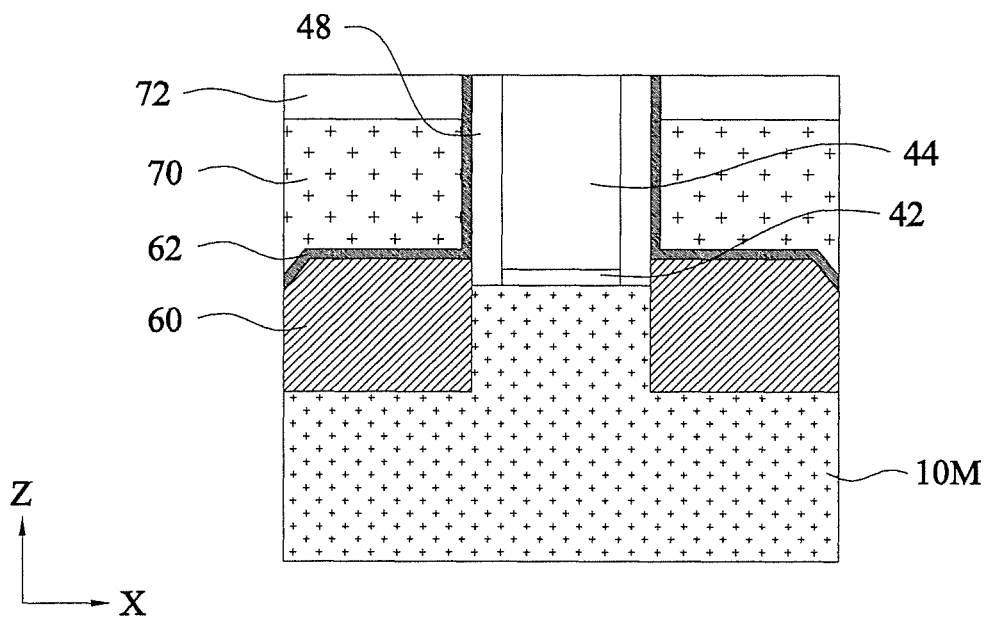

Subsequently, an etch-stop layer (ESL) 62 is formed over the source/drain epitaxial layer 60 and the dummy gate structure 40. Further, a first interlayer dielectric (ILD) layer 70 is formed over the ESL 62. In some embodiments, an additional dielectric layer 72 is formed over the ILD layer. Further, a planarization operation, such as chemical mechanical polishing, is performed, thereby obtaining the structures of FIGS. 9A and 9B. FIG. 9A is an exemplary cross sectional views along the X direction and FIG. 9B is an exemplary cross sectional view along the Y direction. By the planarization process, the upper surface of the dummy gate electrode 44 is exposed.

The first ILD layer 70 may include a single layer or multiple layers. In some embodiments, the ILD layer 70 includes $SiO_2$, SiCN, SiOC, SiON, SiOCN, SiN or a low-k material, but other suitable dielectric film may be used. The ILD layer 70 maybe formed by CVD, PECVD or ALD, FCVD, or a spin-on-glass process. The additional dielectric layer 72 is made of different material than the ILD layer 70 and is made of one or more layers of $SiO_2$, SiCN, SiOC, SiON, SiOCN, SiN, or any other suitable dielectric material. In certain embodiments, the additional dielectric layer 72 is made of SiN.

FIGS. 10-18B show various stages for manufacturing a regular FinFET and an NC-FinFET according to some embodiments of the present disclosure.

Figure 10:
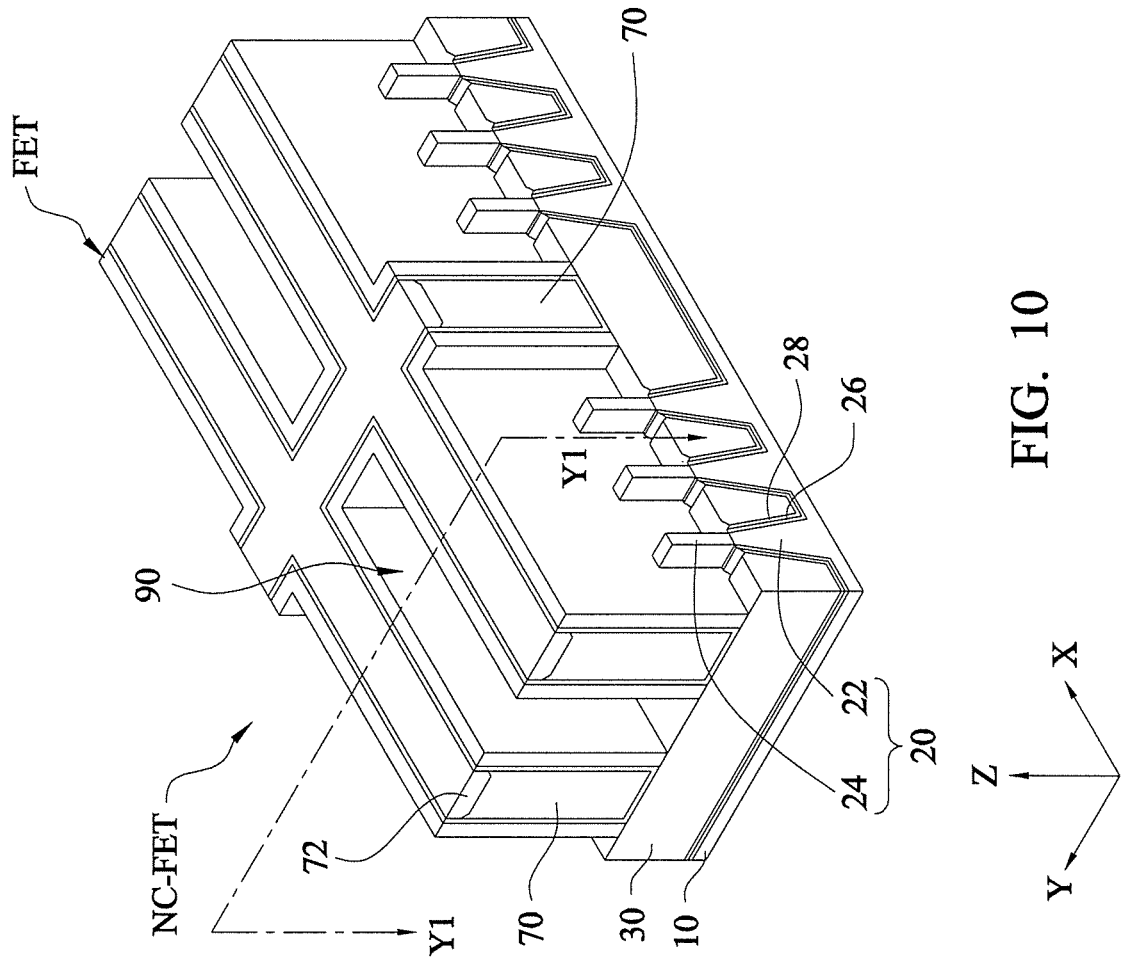
FIG. 10 shows an exemplary perspective view illustrating one of the various stages for manufacturing a semiconductor device according to some embodiments of the present disclosure.

FIG. 10 shows an exemplary perspective view after gate spaces 90 are formed by removing the dummy gate electrode 44 and the dummy gate dielectric layer 42. In FIG. 10, the structure for an NC-FET and the structure for a regular FinFET are disposed adjacent to each other with a first ILD layer 70 interposed therebetween. Of course, the structure for the NC-FET and the structure for the regular FinFET may not necessarily be disposed adjacent to each other.

After the dummy gate electrode 44 and the dummy gate dielectric layer 42 are removed, upper portions 24 of the fin structures 20, which become channels, are exposed in the gate spaces 90, while lower portions 22 of the fin structures 20 are embedded in the isolation insulating layer 30. In some embodiments, a first fin liner layer 26 is formed on the lower portions 22 of the fin structures 20, and a second fin liner layer 28 is formed on the first fin liner layer 26. Each of the liner layers has a thickness between about 1 nm and about 20 nm in some embodiments. In some embodiments, the first fin liner layer 26 includes silicon oxide and has a thickness between about 0.5 nm and about 5 nm, and the second fin liner layer 28 includes silicon nitride and has a thickness between about 0.5 nm and about 5 nm. The liner layers may be deposited through one or more processes such as physical vapor deposition (PVD), chemical vapor deposition (CVD), or atomic layer deposition (ALD), although any acceptable process may be utilized.

Figure 11:
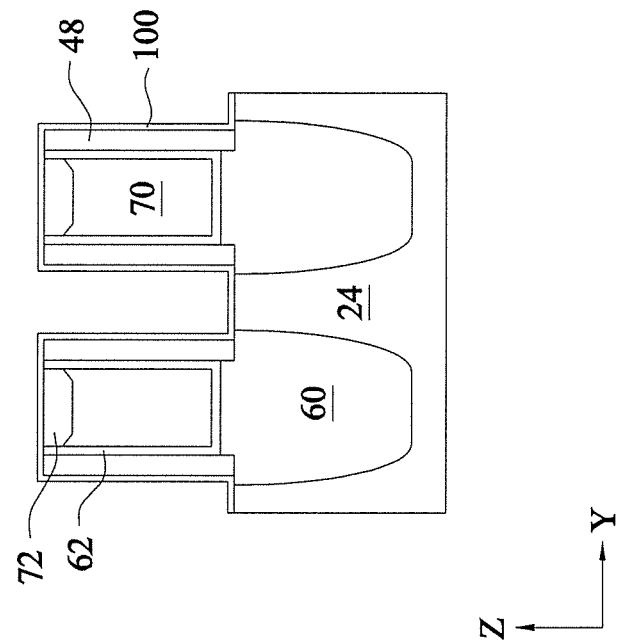
FIG. 11 shows an exemplary cross sectional view illustrating one of the various stages for manufacturing a semiconductor device according to some embodiments of the present disclosure.

After the dummy gate electrode 44 and the dummy gate dielectric layer 42 are removed, a gate dielectric layer 100 is conformally formed over the upper portions 24 (channels) of the fin structures, side faces of the insulating structure including the ILD layer 70, the sidewall spacers 48 and the dielectric layer 72, as show in FIG. 11. FIG. 11 is the cross sectional view corresponding the line Y1-Y1 of FIG. 10.

In some embodiments, the gate dielectric layer 100 includes one or more high-k dielectric layers (e.g., having a dielectric constant greater than 3.9). For example, the one or more gate dielectric layers may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN, $Al_2O_3$, $La_2O_3$, $Ta_2O_3$, $Y_2O_3$, $HfO_2$, $ZrO_2$, $GeO_2$, $ZrO_2$, $HfZrO_2$, $Ga_2O_3$, $Gd_2O_3$, $TaSiO_2$, $TiO_2$. HfSiON, $YGe_xO_y$, $YSi_xO_y$ and $LaAlO_3$, and the like. The formation methods of gate dielectric layer 100 include molecular-beam deposition (MBD), ALD, PVD, and the like. In some embodiments, the gate dielectric layer 100 has a thickness of about 0.5 nm to about 5 nm.

In some embodiments, an interfacial layer (not shown) may be formed over the channels 24 prior to forming the gate dielectric layer 100, and the gate dielectric layer 100 is formed over the interfacial layer. The interfacial layer helps buffer the subsequently formed high-k dielectric layer from the underlying semiconductor material. In some embodiments, the interfacial layer is a chemical silicon oxide, which may be formed by chemical reactions. For example, a chemical silicon oxide may be formed using deionized water+ozone ($DIO_3$), $NH_4OH+H_2O_2+H_2O$ (APM), or other methods. Other embodiments may utilize a different material or processes for the interfacial layer. In an embodiment, the interfacial layer has a thickness of about 0.2 nm to about 1 nm.

Figure 12:
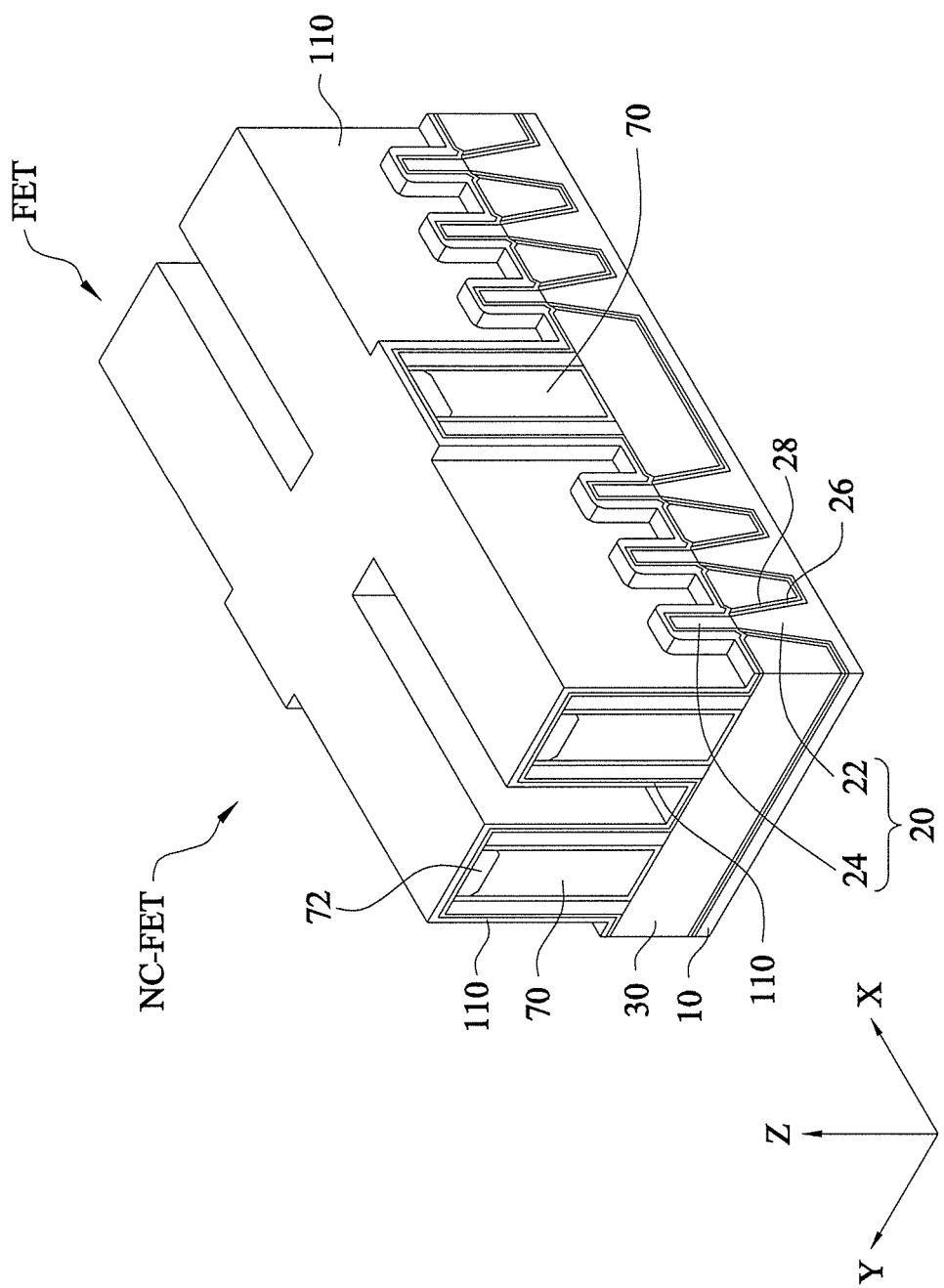
FIG. 12 shows an exemplary perspective view illustrating one of the various stages for manufacturing a semiconductor device according to some embodiments of the present disclosure.

Subsequently, a work function adjustment metal (WFM) layer 110 is forming over the gate dielectric layer 100, as shown in FIG. 12.

The WFM layer 110 is made of one or more layers of conductive material, such as a single layer of TiN, TaN, TaAlC, TiC, TaC, Co, Al, TiAl, HfTi, TiSi, TaSi or TiAlC, or a multilayer of two or more of these materials. For the n-channel FinFET, one or more of TaN, TaAlC, TiN, TiC, Co, TiAl, HfTi, TiSi and TaSi is used as the work function adjustment layer, and for the p-channel FinFET, one or more of TiAlC, Al, TiAl, TaN, TaAlC, TiN, TiC and Co is used as the work function adjustment layer.

The thickness and the material of the WFM layer 110 can be selected for the types (p or n) of FETs and operational voltages. When the thickness is WFM layer 110 is small with respect to the aspect ratio of the gate space 90, the WFM layer 110 can be conformally formed on the bottom and the sides of the gate space 90 on which the gate dielectric layer 100 is formed, such that the gate space 90 is not filled with the WFM layer 110, as shown in FIG. 12. When the thickness is WFM layer 110 is large with respect to the aspect ratio of the gate space 90, the WFM layer 110 fills the gate space 90 on which the gate dielectric layer 100 is formed.

Figures 13A, 13B:
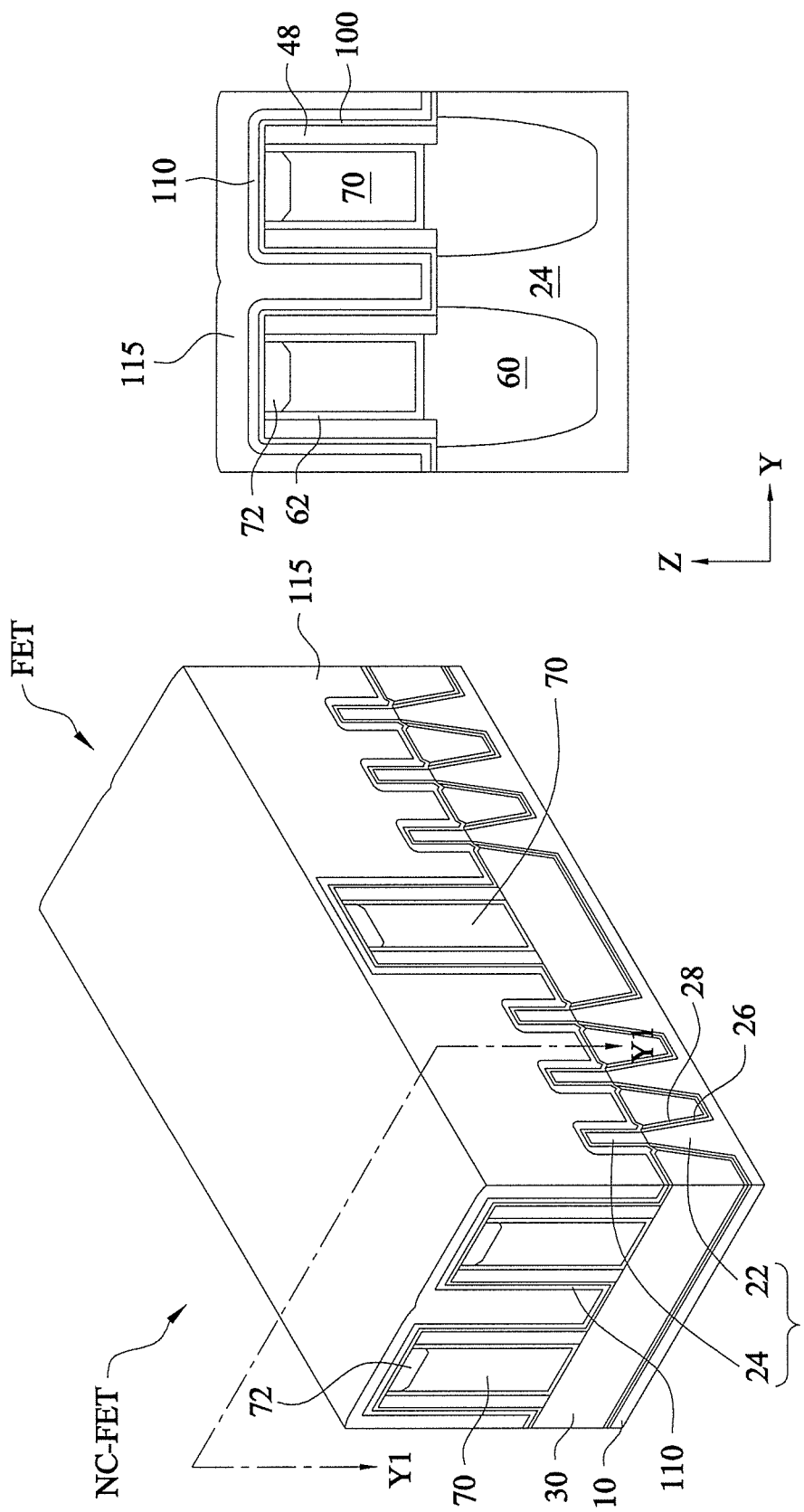
FIG. 13A shows an exemplary perspective view illustrating one of the various stages for manufacturing a semiconductor device according to some embodiments of the present disclosure.
FIG. 13B shows an exemplary cross sectional view illustrating one of the various stages for manufacturing a semiconductor device according to some embodiments of the present disclosure.

Then, a first conductive layer 115 for a first gate electrode (internal gate) for the NC-FET and a metal gate electrode for the regular FET is formed over the WFM layer 110, as shown in FIGS. 13A and 13B. FIG. 13B is the cross sectional view corresponding the line Y1-Y1 of FIG. 13A. The first conductive layer 115 fills the gate space 90, and may be formed over the insulating structure.

The conductive material for the first conductive layer 115 includes one or more material selected from a group of W, Cu, Ti, Ag, Al, TiAl, TiAlN, TaC, TaCN, TaSiN, Mn, Co, Pd, Ni, Re, Ir, Ru, Pt, Zr, TiN, WN, TaN, Ru, alloys such as Ti—Al, Ru—Ta, Ru—Zr, Pt—Ti, Co—Ni, $WN_x$, $TiN_x$, $MoN_x$, $TaN_x$, and $TaSi_xN_y$. In one embodiment, W is used as the first conductive layer 115. In some embodiments, the first conductive layer 115 may be formed using a suitable process such as ALD, CVD, PVD, plating, or combinations thereof.

Figure 14:
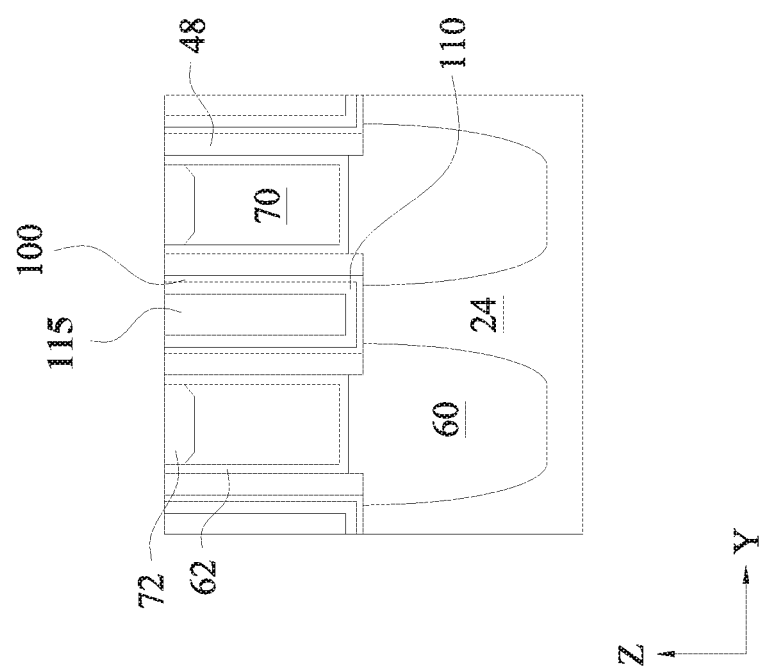
FIG. 14 shows an exemplary cross sectional view illustrating one of the various stages for manufacturing a semiconductor device according to some embodiments of the present disclosure.

Subsequently, a planarization process, such as a CMP, is performed to remove excess materials, as shown in FIG. 14. By this operation, a metal gate structure for the regular FET is formed (except for a gate cap insulating layer).

Figure 15B:
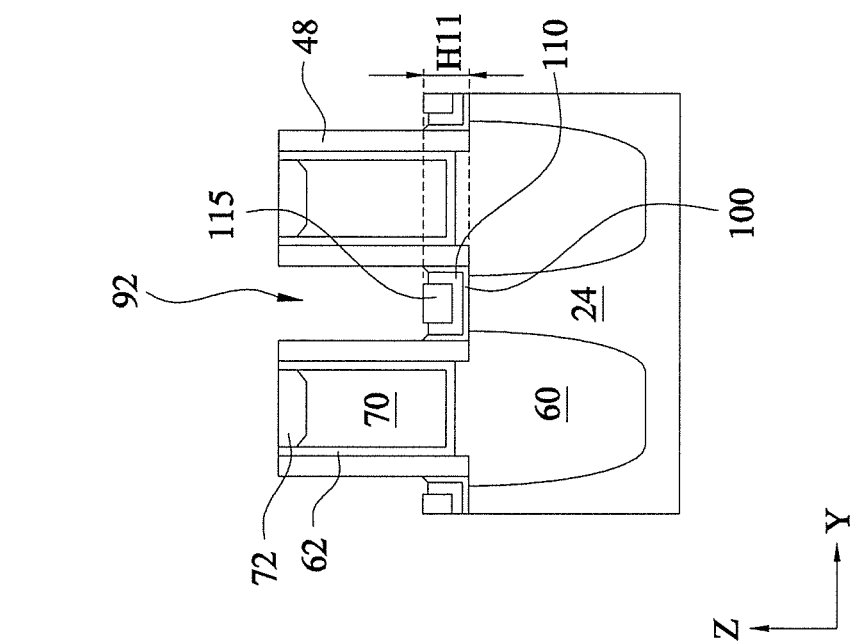
FIG. 15B shows an exemplary cross sectional view illustrating one of the various stages for manufacturing a semiconductor device according to some embodiments of the present disclosure.
Figure 15A:
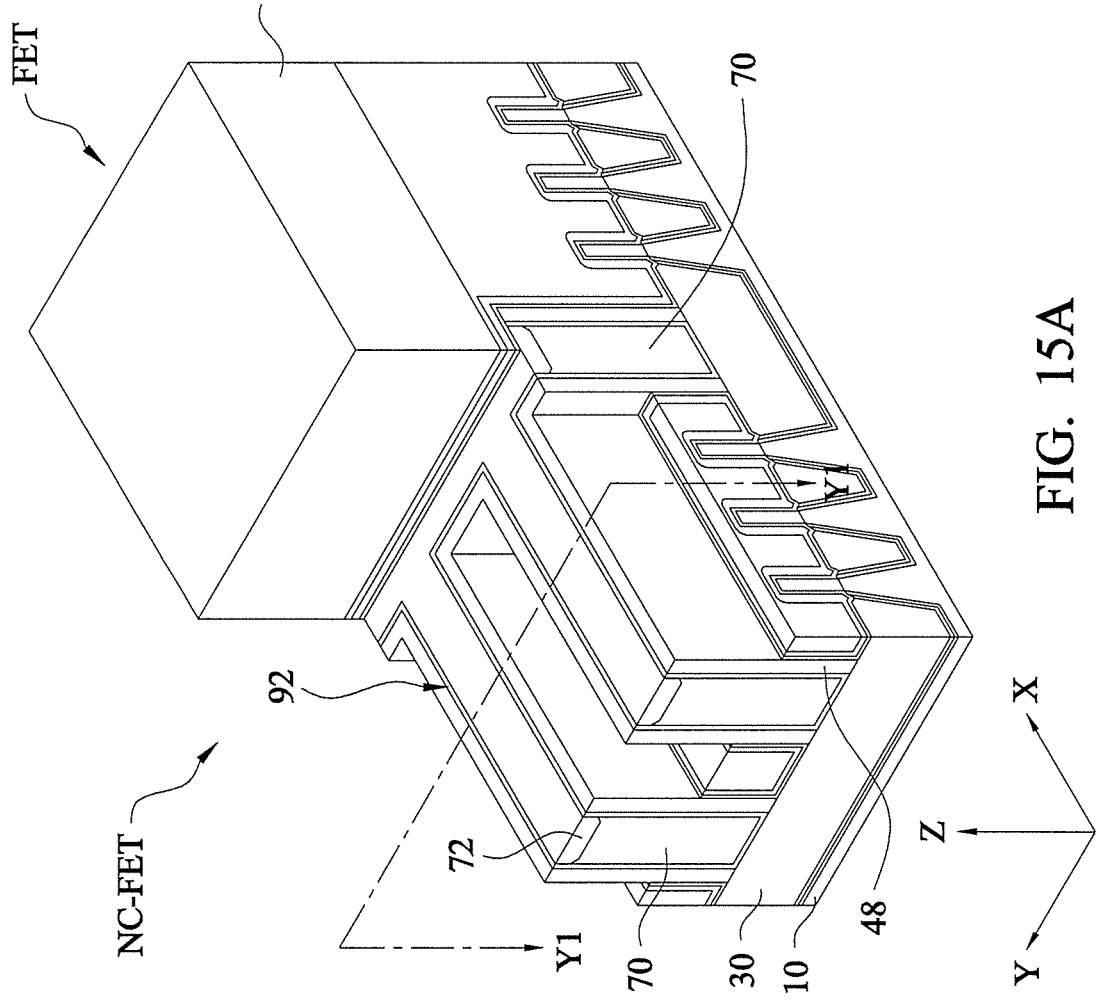
FIG. 15A shows an exemplary perspective view illustrating one of the various stages for manufacturing a semiconductor device according to some embodiments of the present disclosure.

Then, the structures for the regular FETs are covered by a mask layer 95 as shown in FIG. 15A, and the first conductive layer 115, the WFM layer 110 and the gate dielectric layer 100 for the NC-FETs are recessed by using an etching operation, thereby forming a recessed gate space 92 as shown in FIGS. 15A and 15B. FIG. 15B is the cross sectional view corresponding the line Y-Y1 of FIG. 15A. The mask layer 95 may be a photo resist pattern or a hard mask pattern.

In some embodiments, the height H11 of the remaining first conductive layer 115 from the channel 24 is in a range from about 5 nm to about 50 nm in some embodiments. In certain embodiments, due to different etching rates, the WFM layer 110 is etched more than the first conductive layer 115, and the remaining first conductive layer 115 protrudes from the WFM layer 110. In certain embodiments, the gate dielectric layer 100 is not etched. After the recess etching, the mask layer 95 is removed.

Figures 16A, 16B:
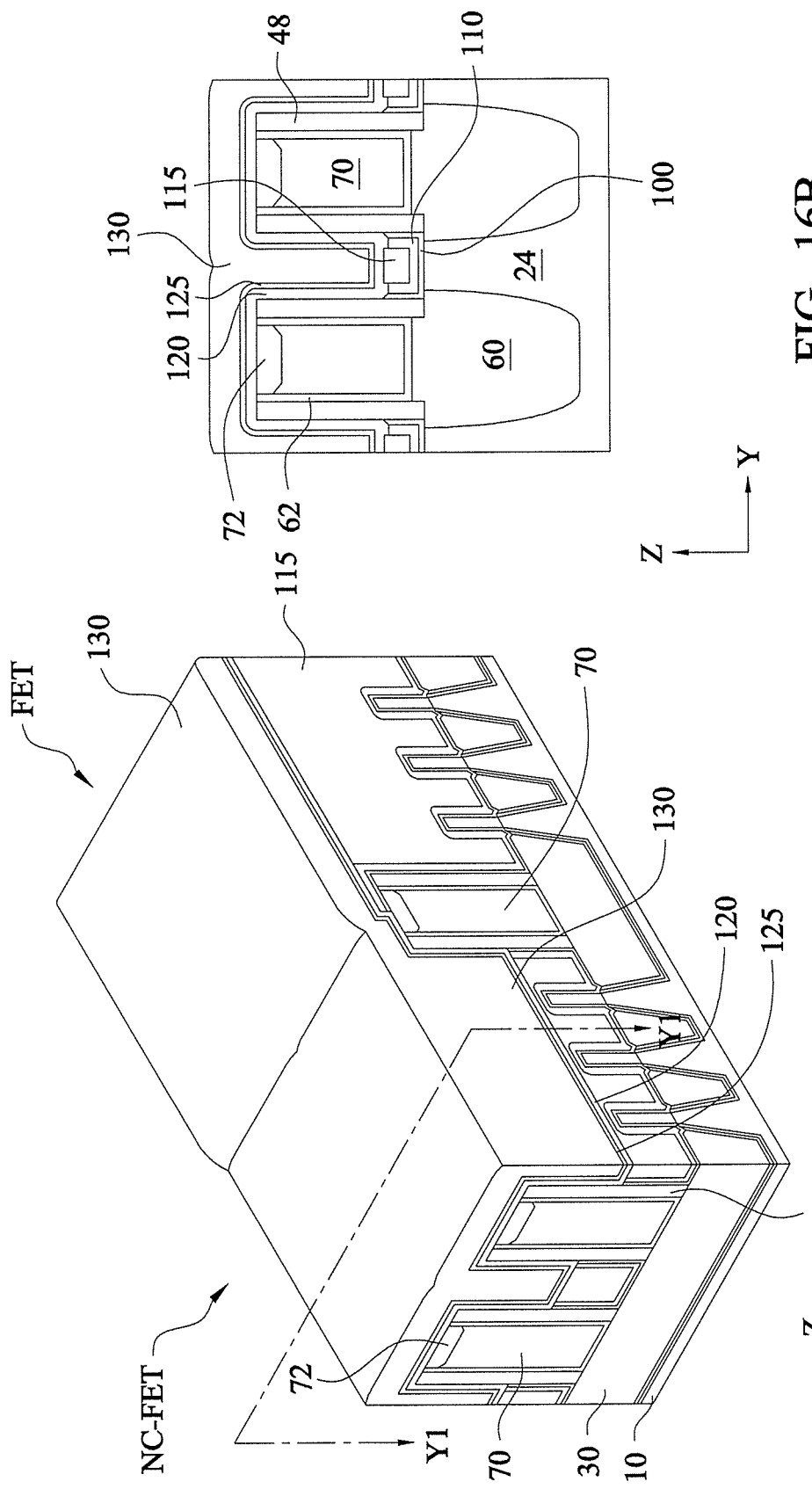
FIG. 16A shows an exemplary perspective view illustrating one of the various stages for manufacturing a semiconductor device according to some embodiments of the present disclosure.
FIG. 16B shows an exemplary cross sectional view illustrating one of the various stages for manufacturing a semiconductor device according to some embodiments of the present disclosure.

Then, the ferroelectric layer 120, a conductive liner layer 125 and a second conductive layer 130 are sequentially formed in the recessed gate space 92, as shown in FIGS. 16A and 16B. FIG. 16B is the cross sectional view corresponding the line Y-Y1 of FIG. 16A.

The ferroelectric layer 120 is made of one or more material selected from the group consisting of $Pb_3Ge_5O_{11}$ (PGO), lead zirconate titanate (PZT), $SrBi_2Ta_2O_9$ (SBT or SBTO), $SrB_4O_7$ (SBO), $Sr_aBi_bTa_cNb_dO_x$ (SBTN), $SrTiO_3$ (STO), $BaTiO_3$ (BTO), $(Bi_xLa_y)Ti_3O_{12}$ (BLT), $LaNiO_3$ (LNO), $YMnO_3$, $ZrO_2$, zirconium silicate, ZrAlSiO, $HfO_2$, $HfZrO_2$, hafnium silicate, HfAlO, LaAlO, lanthanum oxide, $HfO_2$ doped with Si ($HfSiO_x$), and $Ta_2O_5$. In some embodiments, $PbZr_{0.5}Ti_{0.5}O_3$ or $Hf_{0.5}Zr_{0.5}O_2$ is used as the ferroelectric layer 120.

The thickness of the ferroelectric layer 120 is in a range from about 1 nm to about 20 nm in some embodiments, and may be formed by a suitable process such as ALD or CVD. As shown in FIG. 16B, the ferroelectric layer 120 is conformally formed in some embodiments.

The conductive liner layer 125 is an adhesive layer for the second conductive layer, and is made of, for example, Ti, Ta, TiN and/or TaN. The thickness of the conductive liner layer 125 is in a range from about 0.5 nm to about 10 nm in some embodiments, and may be formed by a suitable process such as ALD, CVD, PVD, plating, or combinations thereof. As shown in FIG. 16B, the conductive liner layer 125 is conformally formed in some embodiments.

The second conductive layer 130 is made of the same as or similar material to the first conductive layer 115, and may be formed using a suitable process such as ALD, CVD, PVD, plating, or combinations thereof. In one embodiment, W is used as the second conductive layer 130.

After the second conductive layer 130, an annealing operation is performed, thereby transforming the phase of the ferroelectric layer from a polycrystalline structure to a crystalline structure, for example, an orthorhombic structure which exhibits ferroelectricity. The annealing operation includes rapid thermal annealing (RTA) performed at a temperature between about 400° C. to about 900° C., in some embodiments.

Subsequently, a planarization process, such as a CMP, is performed to remove excess materials, as shown in FIGS. 17A and 17B. FIG. 17B is the cross sectional view corresponding the line Y-Y1 of FIG. 17A. By this operation, upper portions of the sidewall spacers 48, the ESL layer 62 and the dielectric layer 72 are exposed. The ferroelectric layer 120 and the conductive liner layer 125 formed in the regular FET region are removed by the planarization operation.

Figures 18A, 18B:
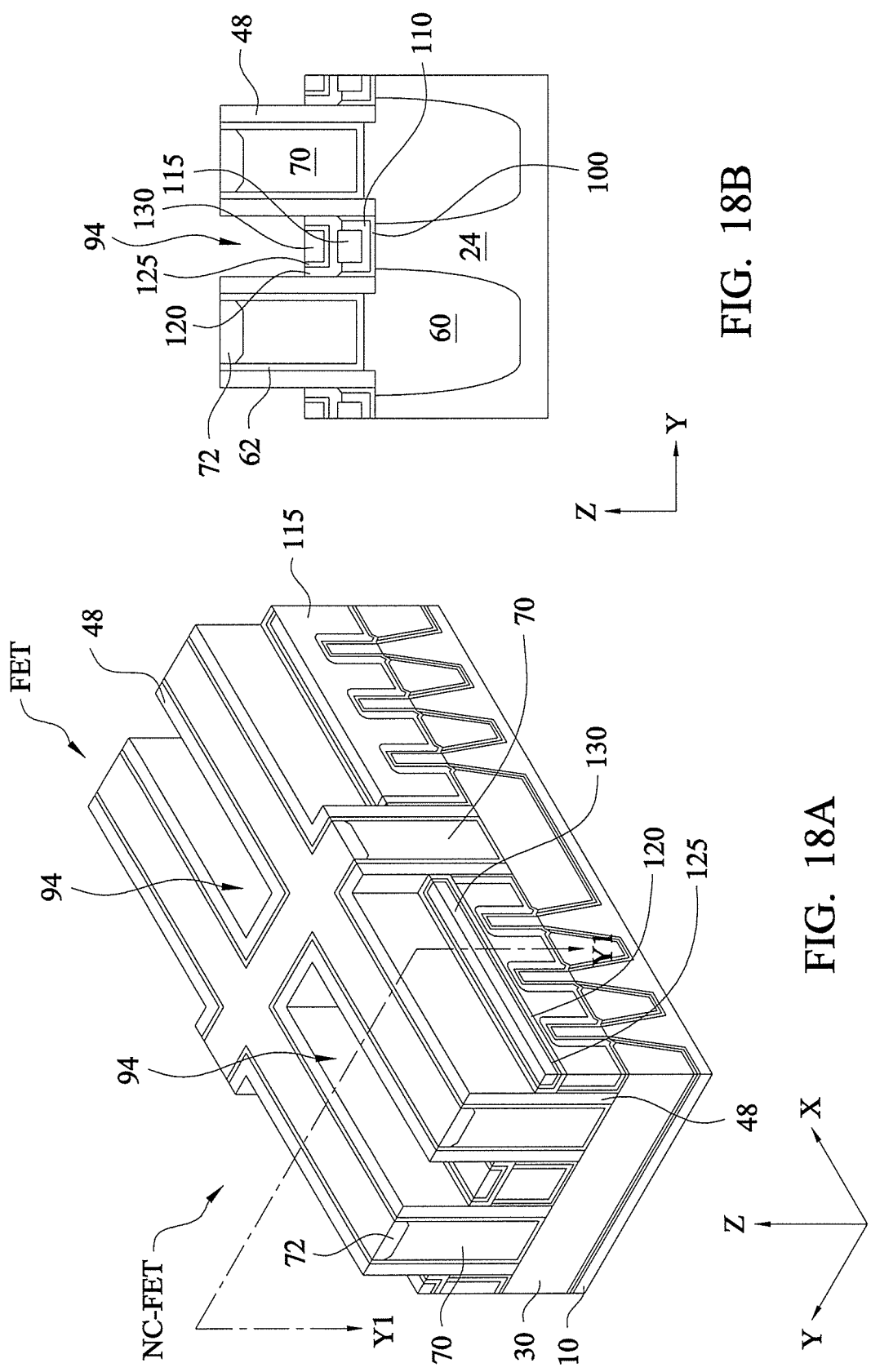
FIG. 18A shows an exemplary perspective view illustrating one of the various stages for manufacturing a semiconductor device according to some embodiments of the present disclosure.
FIG. 18B shows an exemplary cross sectional view illustrating one of the various stages for manufacturing a semiconductor device according to some embodiments of the present disclosure.

Then, a recess etching operation is performed, thereby reducing the height of the gate structure for the NC-FinFET and the height of the gate structure for the regular FET and forming a second recessed gate space 94, as shown in FIGS. 18A and 18B.

Figures 19A, 19B:
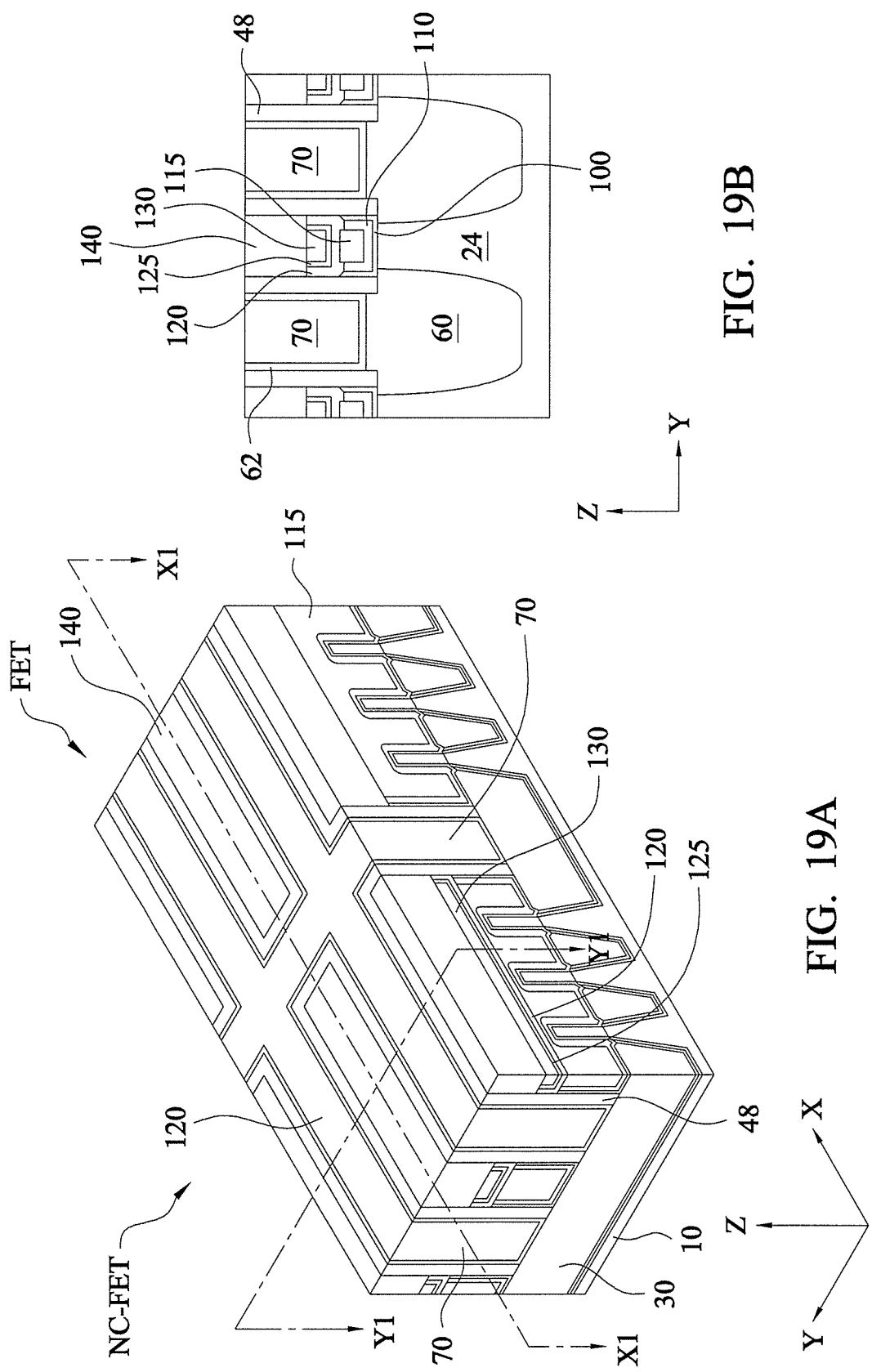
FIG. 19A shows an exemplary perspective view illustrating one of the various stages for manufacturing a semiconductor device according to some embodiments of the present disclosure.
FIG. 19B shows an exemplary cross sectional view illustrating one of the various stages for manufacturing a semiconductor device according to some embodiments of the present disclosure.

Further, as shown in FIGS. 19A and 19B, the recess etching operation, a gate cap layer 140 is formed in the second recessed gate space 94 to protect the gate electrodes during subsequent processes. In some embodiments, the gate cap layer 140 includes $SiO_2$, SiCN, SiON, SiN, $Al_2O_3$, $La_2O_3$, SiN, a combination thereof, or the like, but other suitable dielectric films may be used. The gate cap layer 140 may be formed using, for example, CVD, PVD, spin-on-glass, or the like. Other suitable process steps may be used. A planarization process, such as a CMP, may be performed to remove excess materials. During the planarization process, the dielectric layer 72 is also removed, as shown in FIGS. 19A and 19B, in some embodiments. The thickness of the gate cap layer 140 after the planarization process is in a range from about 5 nm to about 50 nm in some embodiments.

Figure 20A:
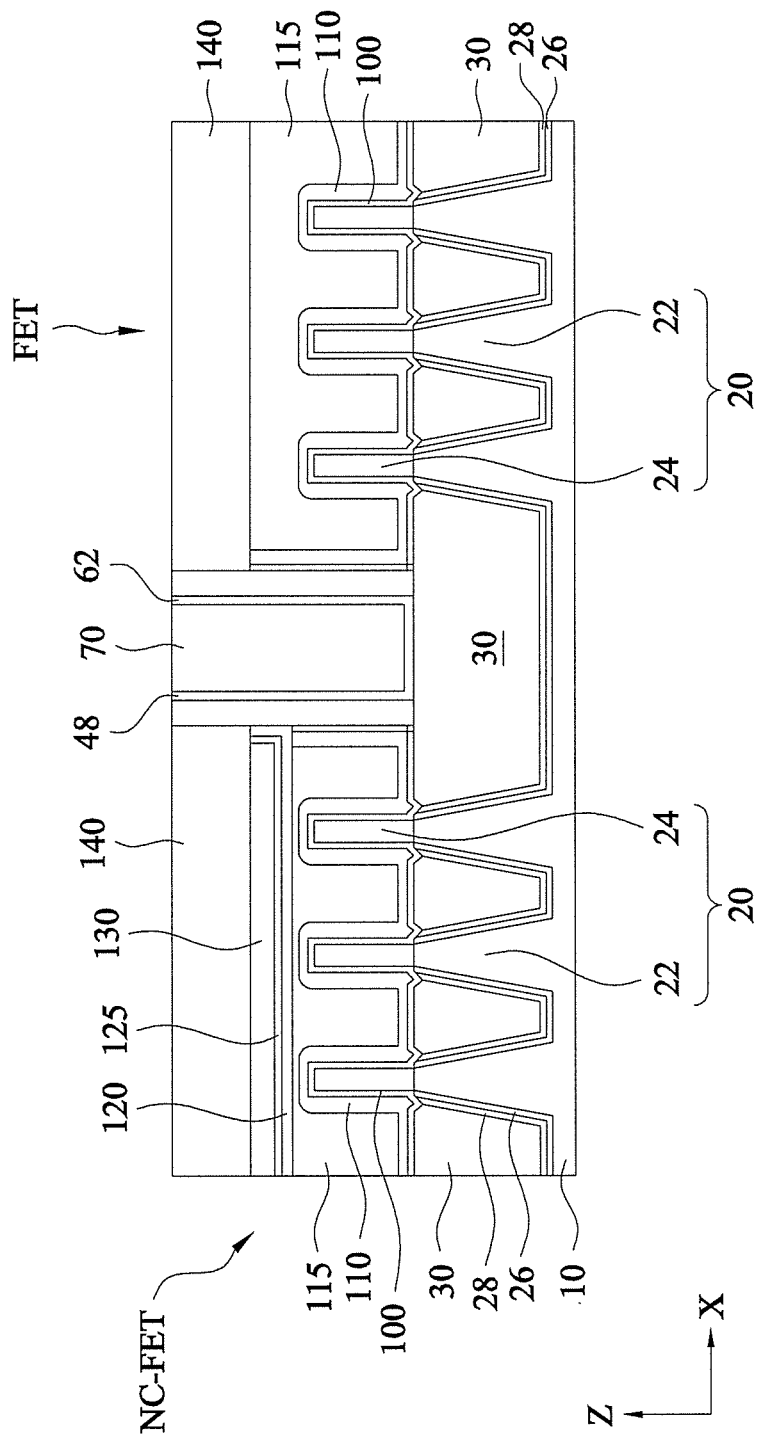
FIG. 20A shows an exemplary cross sectional view of a semiconductor device according to some embodiments of the present disclosure.
Figure 20C:
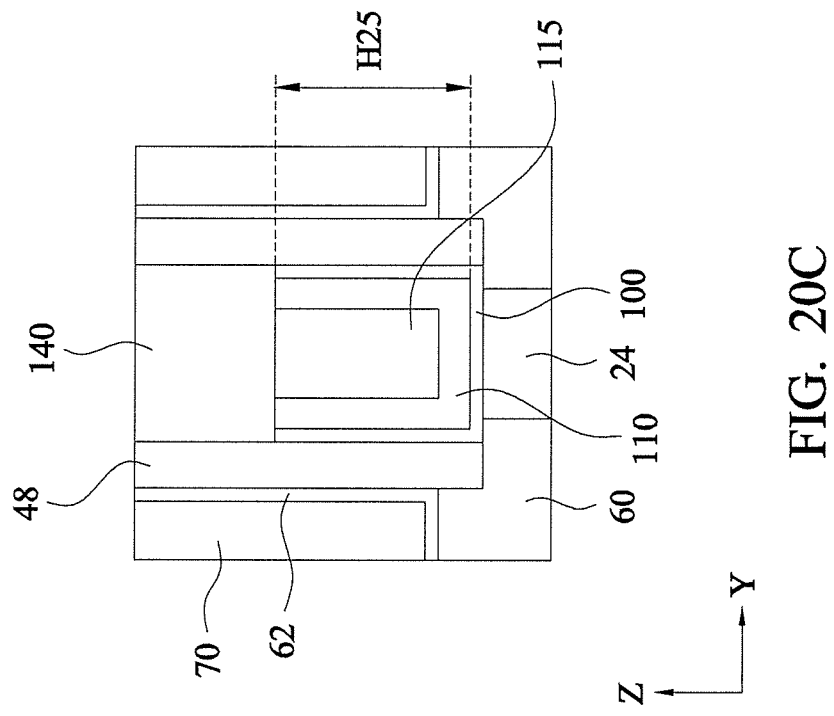
FIG. 20C shows an exemplary cross sectional view of the regular FinFET according to some embodiments of the present disclosure.
Figure 20B:
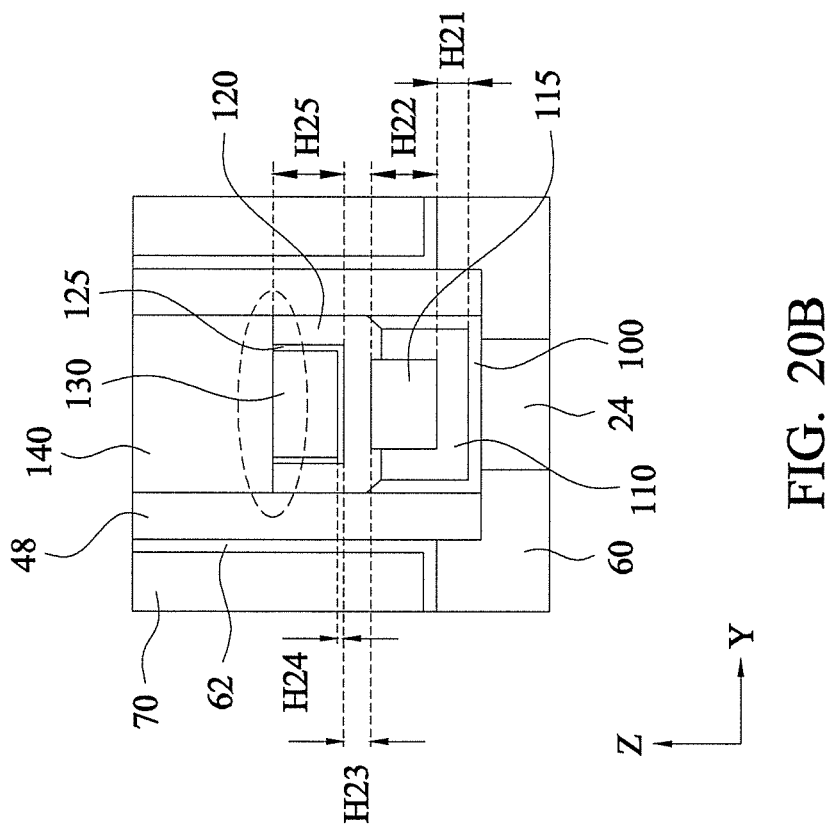
FIG. 20B shows an exemplary cross sectional view of the NC-FinFET portion.

FIG. 20A shows an exemplary cross sectional view of a semiconductor device along the X direction according to some embodiments of the present disclosure. FIG. 20B shows an exemplary cross sectional view of the NC-FinFET portion along the Y direction, and FIG. 20C shows an exemplary cross sectional view of the regular FinFET portion along the Y direction according to some embodiments of the present disclosure.

As shown in FIG. 20A, the NC-FinFET portion includes an MIM structure formed by the second conductive layer 130, the conductive liner layer 125, the ferroelectric layer 120 and the first conductive layer 115, together with a MOS structure formed by the first conductive layer 115, the WFM layer 110, the gate dielectric layer 100 and the channel 24, while the regular FinFET portion includes the MOS structure only.

In the NC-FinFET portion, the upper surface of the MIM structure is substantially flat, as shown in FIG. 20B. In other words, a bottom of the gate cap insulating layer 140 is substantially flat, which means that the variation is less than 1.0 nm.

The thickness H21 of the WFM layer 110 above the channel (upper portion of the fin structure) 24 varies depending on the types of the NC-FET (conductivity type and/or operational voltage), and is in a range from about 0.5 nm to about 20 nm in some embodiments. The thickness H22 of the first conductive layer 115 above the channel 24 is in a range from about 5 nm to about 50 nm in some embodiments. The thickness H23 of the ferroelectric layer 120 above the first conductive layer (internal gate) 115 is in a range from about 2 nm to about 20 nm in some embodiments. The thickness H24 of the conductive liner layer 125 above the first conductive layer (internal gate) 115 is in a range from about 0.5 nm to about 10 nm in some embodiments. The thickness H25 of the second conductive layer 130 above the channel 24 is in a range from about 5 nm to about 50 nm in some embodiments. In certain embodiments, H22 is equal to or greater than H25, and in other embodiments, H22 is smaller than H25.

In the regular FinFET portion, the height H25 of the metal gate (the first conductive layer 115 and the WFM layer 110) above the channel (upper portion of the fin structure) 24 is in a range from about 10 nm to about 110 nm in some embodiments.

As shown in FIGS. 20B and 20C, the gate dielectric layer 100 and the WFM layer 110 have a "U-shape" in the Y directional cross section having a thin center portion and thick side portions, and as shown in FIG. 20A, the gate dielectric layer 100 and the WFM layer 110 have a "U-shape" between adjacent channels 24 and/or between the sidewall spacer 48 and the channel 24, in the X directional cross section.

Further, as shown in FIG. 20B, the ferroelectric layer 120, the conductive liner layer 125 and the second conductive layer 130 have a "U-shape" in the Y directional cross section, as shown in FIG. 20A, the ferroelectric layer 120, the conductive liner layer 125 and the second conductive layer 130 have a "U-shape" between the sidewall spacers 48, in the X directional cross section, although FIG. 20A shows only one end portion of the U-shape.

After forming the gate cap layer 140 to be in direct contact with the second conductive layer 130 for the NC-FET and with the first conductive layer 115 for the regular FET, further CMOS processes are performed to form various features such as additional interlayer dielectric layers, contacts/vias, interconnect metal layers, and passivation layers, etc.

In the present disclosure, as set forth above, the semiconductor device includes multiple threshold voltage (Vth) transistors, for example, an n-channel ultra-low threshold voltage (N-uLVT) FET, an n-channel standard threshold voltage (N-SVT) FET, a p-channel standard threshold voltage (P-SVT) FET and a p-channel ultra-low threshold voltage (P-uLVT) FET. Depending on the thicknesses of the WFM layer, the gates of these four types of FETs have different structures, in some embodiments.

FIGS. 21A-25D show exemplary cross sectional views illustrating the various stages for manufacturing NC-FinFET portions of a semiconductor device according to some embodiments of the present disclosure. In FIGS. 21A-25D, the "A" figures show exemplary views for an N-uLVT FET, the "B" figures show exemplary views for an N-SVT FET, the "C" figures show exemplary views for a P-SVT FET, and the "D" figures show exemplary views for a P-uLVT FET. Material, configuration, dimensions and/or processes are the same as or similar to the foregoing embodiments described with respect to FIGS. 1-20B may be employed in the following embodiments, and detailed explanation thereof may be omitted.

Figure 21A:
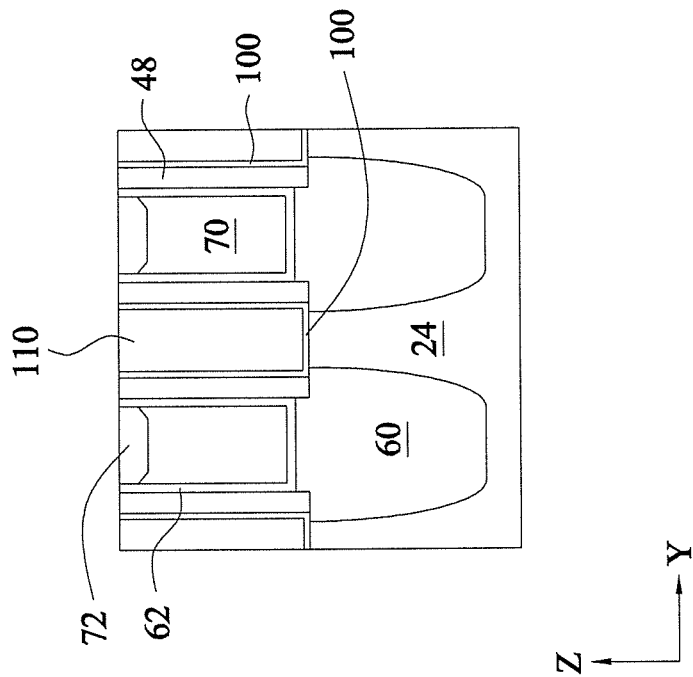
FIGS. 21A-21D show exemplary cross sectional views illustrating one of the various stages for manufacturing a semiconductor device according to various embodiment of the present disclosure.
Figure 21B:
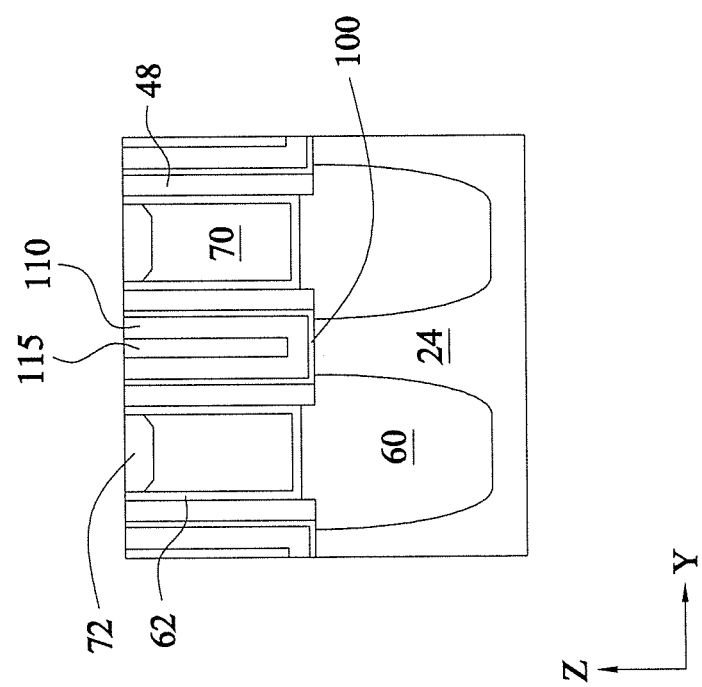
Figure 21C:
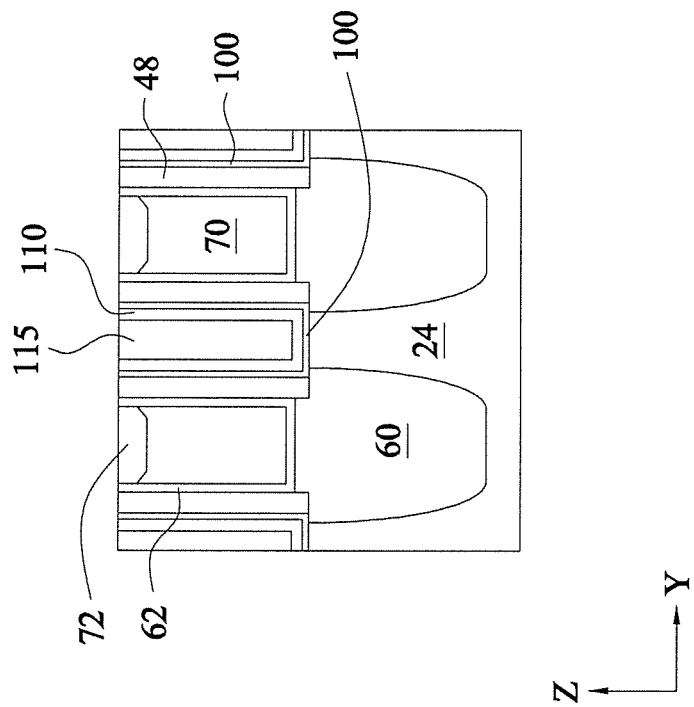
Figure 21D:
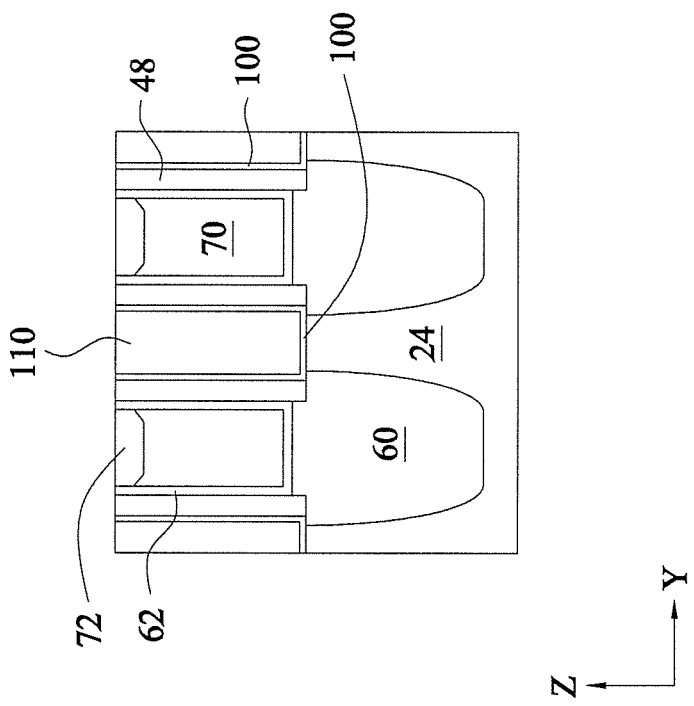
Figure 22A:
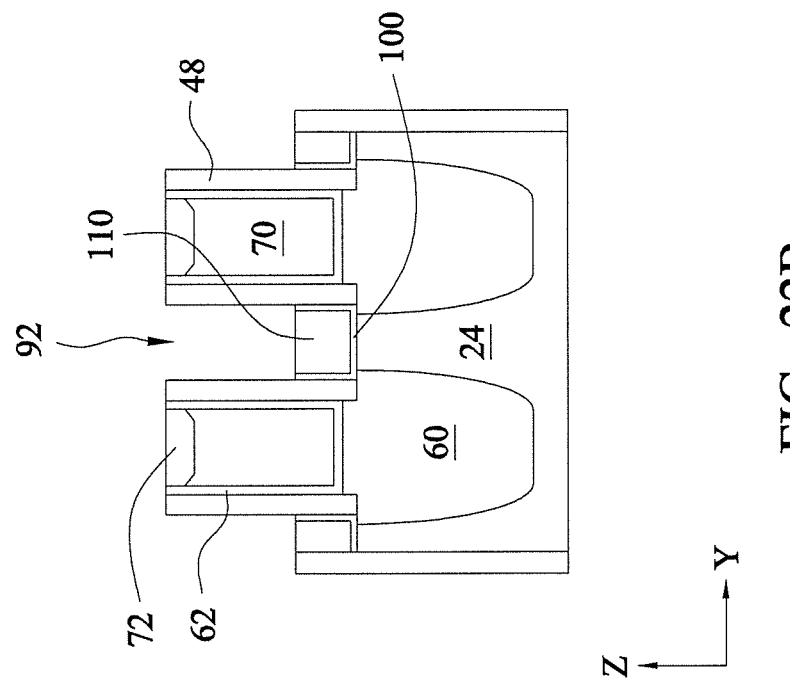
FIGS. 22A-22D show exemplary cross sectional views illustrating one of the various stages for manufacturing a semiconductor device according to various embodiment of the present disclosure.
Figure 22B:
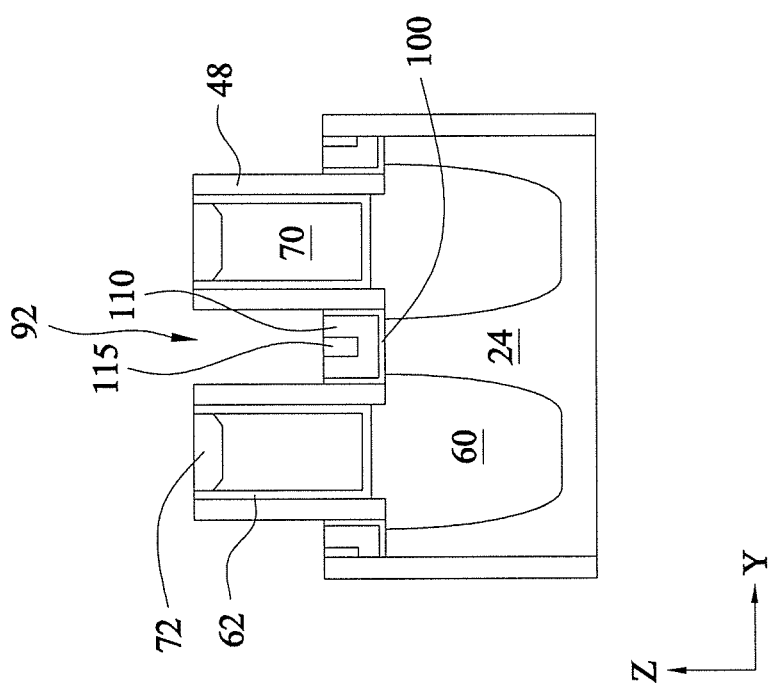
Figure 22C:
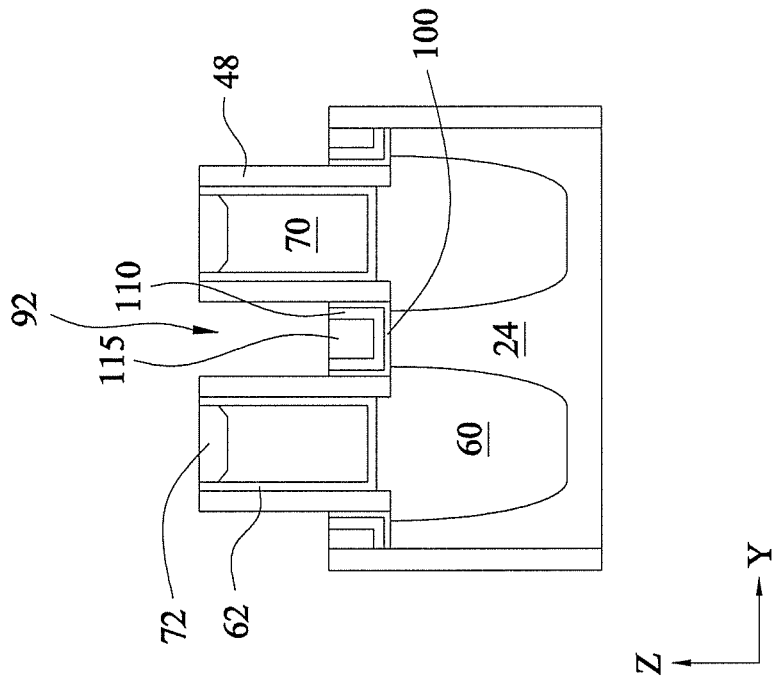
Figure 22D:
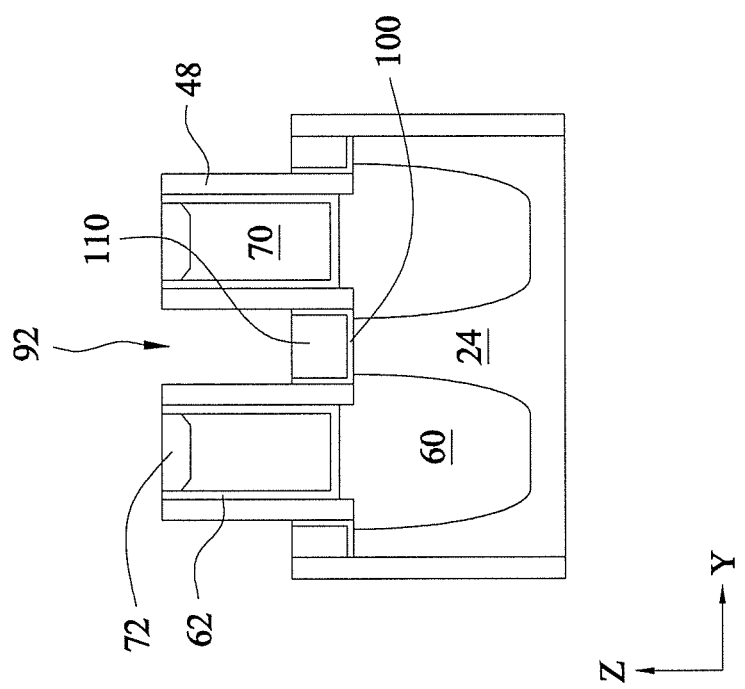
Figure 23A:
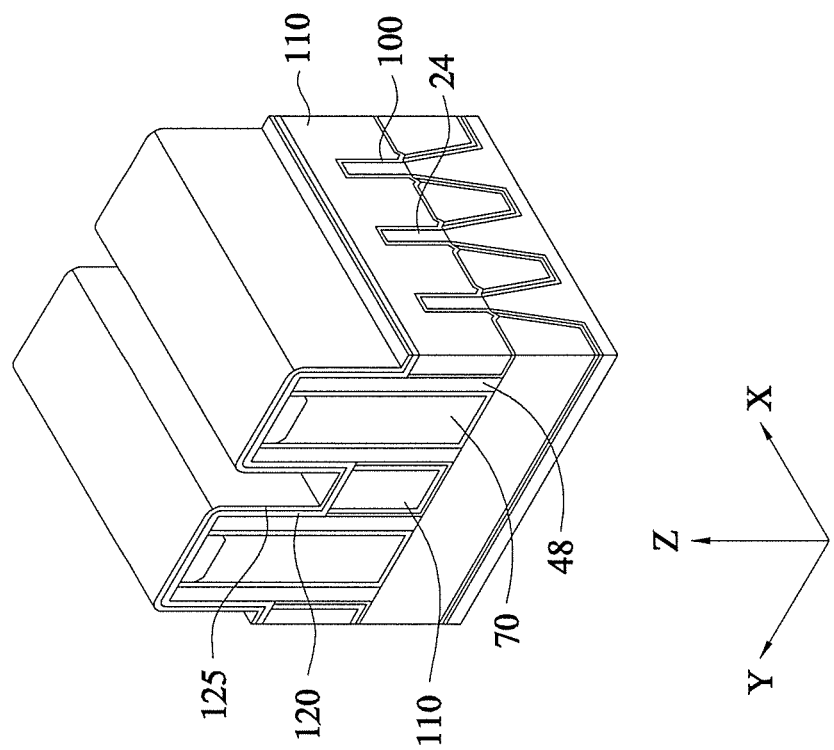
FIGS. 23A-23D show exemplary perspective views illustrating one of the various stages for manufacturing a semiconductor device according to various embodiment of the present disclosure.
Figure 23B:
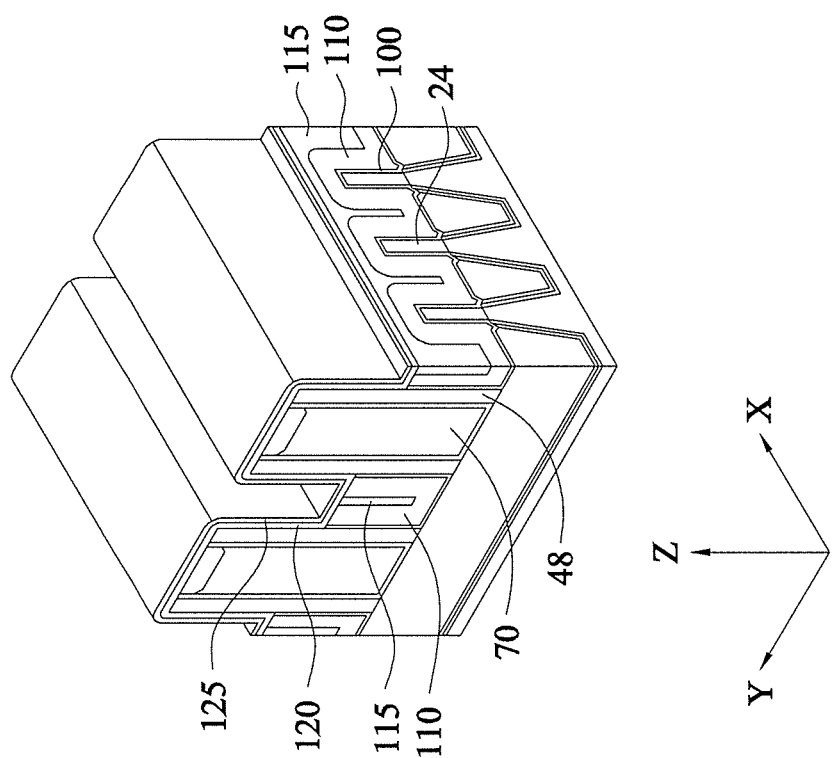
Figure 23C:
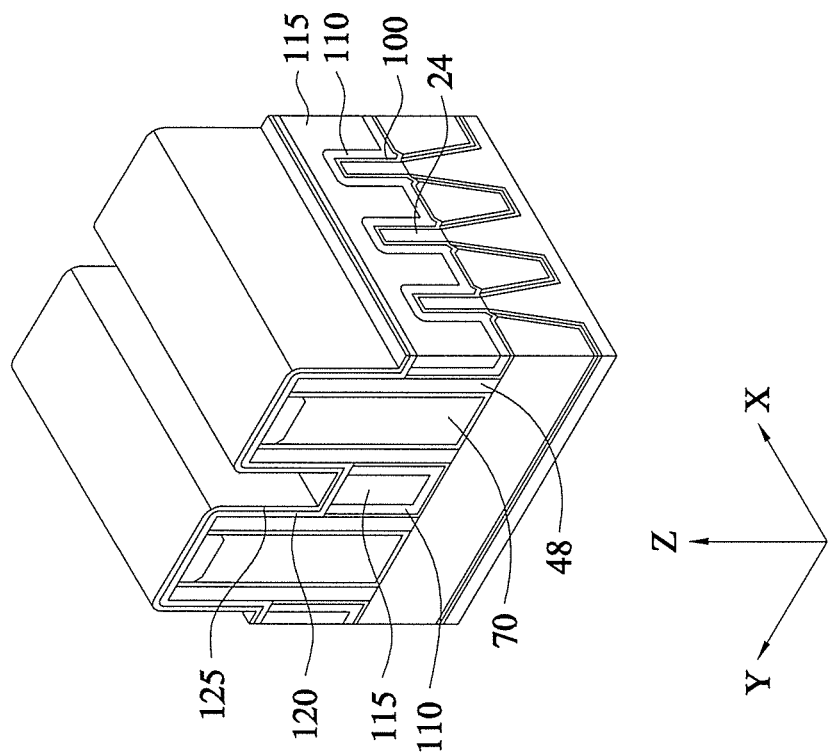
Figure 23D:
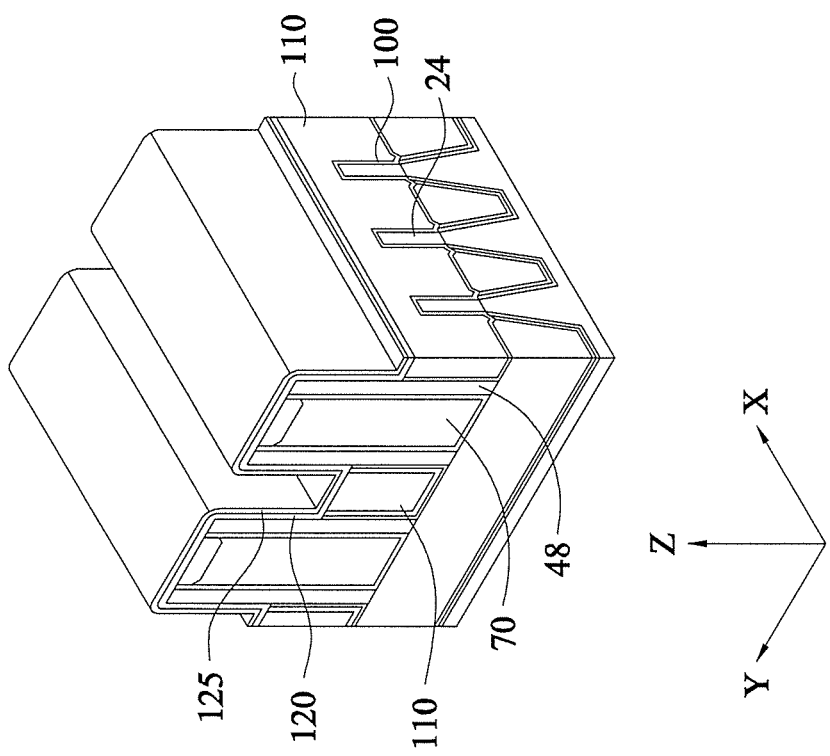

FIGS. 21A-21D show exemplary cross sectional views after the WFM layer 110 and the first conductive layer 115 are formed in the gate spaces 90 by the planarization operation. Comparing the N-uLVT FET and the N-SVT FET, the N-uLVT FET has a WFM layer 110 thinner than the N-SVT FET, as shown in FIGS. 21A and 21B. In some embodiments, the WFM layer 100 for the N-SVT FET completely fills the gate space and thus no second conductive layer is formed in the gate space. Comparing the P-SVT FET and the P-uLVT FET, the P-SVT FET has a WFM layer 110 thicker than the P-uLVT FET, as shown in FIGS. 21C and 21D. In some embodiments, the WFM layer 100 for the P-uLVT FET completely fills the gate space and thus no first conductive layer (for example, W) is formed in the gate space.

Comparing the N-uLVT FET and the P-uLVT FET, the N-uLVT FET has a WFM layer 110 thinner than the P-uLVT FET, as shown in FIGS. 21A and 21D. In some embodiments, the volume of the first conductive layer 115 for the N-uLVT FET is smaller than the volume of the first conductive layer 115 for the P-uLVT FET. For example, in the cross sections along the Y direction, the area for the first conductive layer 115 for the N-uLVT FET is about 70% or less of the area of the first conductive layer 115 for the P-uLVT FET, in some embodiments. In other embodiments, the area for the first conductive layer 115 for the N-uLVT FET is about 1% to about 50% of the area of the first conductive layer 115 for the P-uLVT FET.

After the WFM layer 110 and the first conductive layer 115 are formed in the gate spaces 90, as shown in FIGS. 22A-22D, the WFM layer 110 and/or the first conductive layer 115 are recessed, thereby forming a recessed gate space 92, by operations similar to FIGS. 15A and 15B.

FIGS. 23A-24D show exemplary views after the ferroelectric layer 120 and the conductive liner layer 125 are formed over the recessed WFM layer 110 and/or first conductive layer 115. FIGS. 23A-23D show exemplary perspective views, FIGS. 24A-24D show exemplary cross sectional view along the X direction, and FIGS. 25A-25D show exemplary cross sectional view along the Y direction.

For the N-SVT FET and P-SVT-FET, the ferroelectric layer 120 is formed over the WFM layer 110 with no first conductive layer interposed therebetween. Further, the conductive liner layer 125 is formed in the ferroelectric layer 120. For the N-uLVT FET and P-uLVT-FET, the ferroelectric layer 120 is formed over the WFM layer 110 and the first conductive layer 115. The amount of the first conductive layer 115 for the N-uLVT FET is smaller than the amount of the first conductive layer 115 for the P-uLVT FET.

In for all four FETs, since the WFM layer 110 and/or the first conductive layer 115 are recessed to form the recessed gate space, of which width along the Y direction is defined by the sidewall spacers 48, the ferroelectric layer 120 can be conformally formed in the recessed gate space 92, without fully filling the recessed gate space 92. Accordingly the thickness of the ferroelectric layer 120 at the center of the WFM layer 110 and/or the first conductive layer 115 is substantially the same for all four FETs.

Figure 24A:
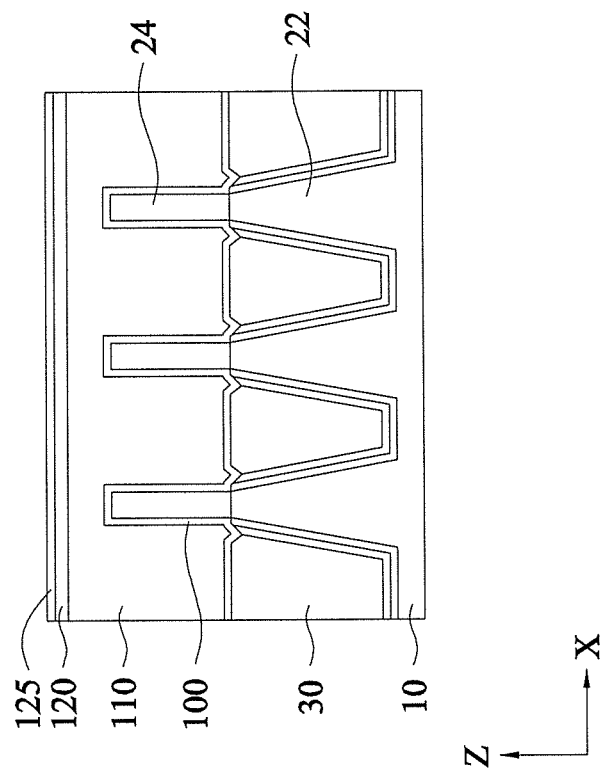
FIGS. 24A-24D show exemplary cross sectional views illustrating one of the various stages for manufacturing a semiconductor device according to various embodiment of the present disclosure.
Figure 24B:
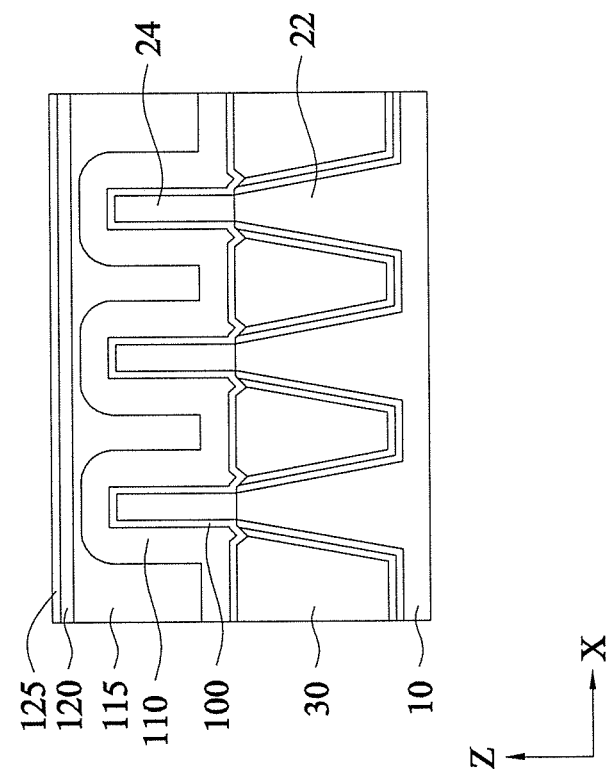
Figures 24C, 24D:
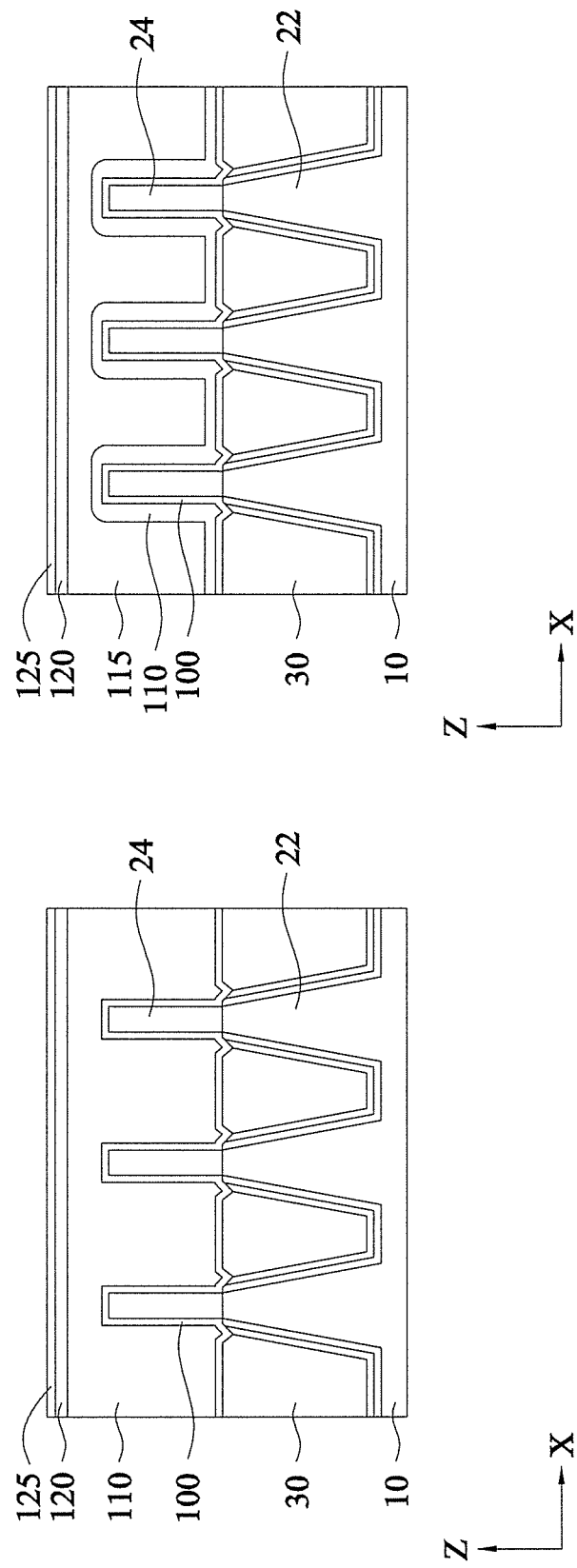
Figure 25A:
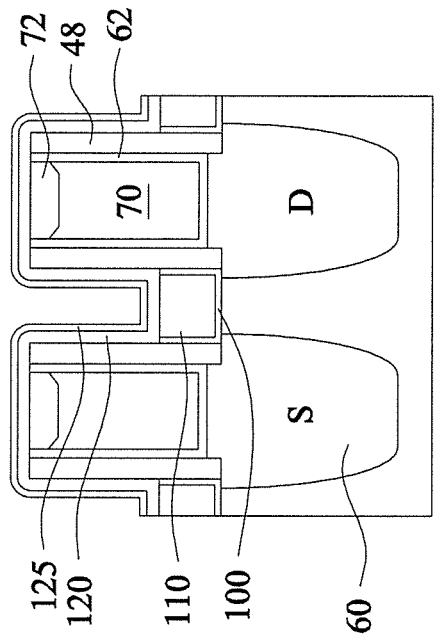
FIGS. 25A-25D show exemplary cross sectional views illustrating one of the various stages for manufacturing a semiconductor device according to various embodiment of the present disclosure.
Figure 25B:
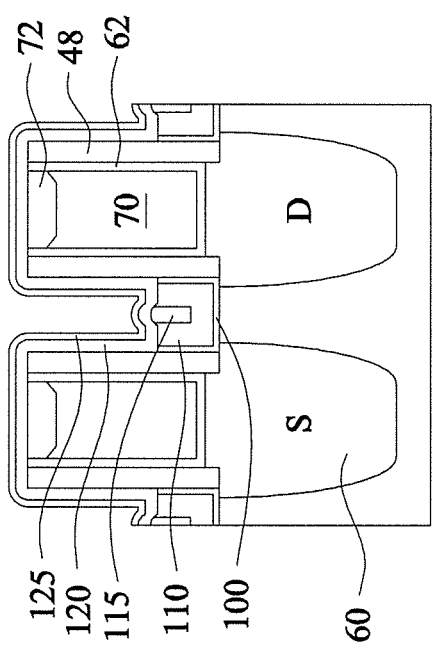
Figure 25C:
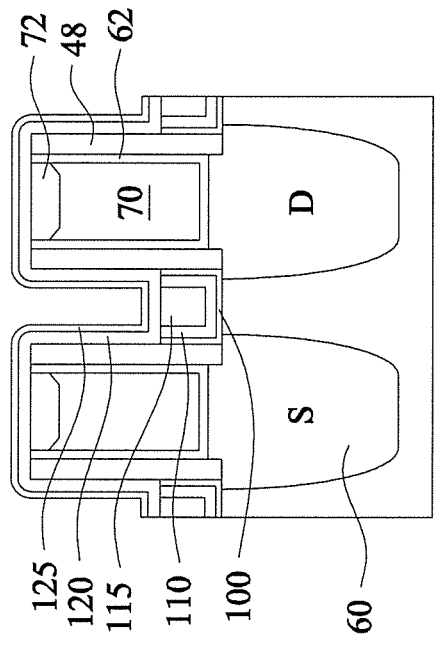
Figure 25D:
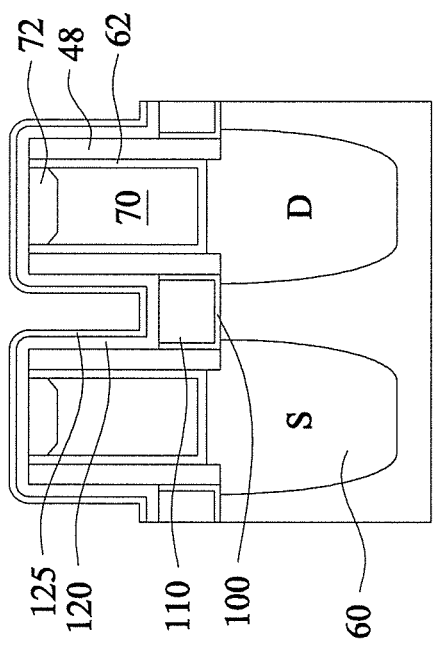

As shown in FIGS. 24A and 24D, the WFM layer 110 can be conformally formed over the channels 24 (upper portion of the fin structure), forming a U-shape cross section, while in FIGS. 24B and 24C, the WFM layer 110 fully fills spaces between the channels 24.

Further, as shown in FIGS. 26A-26D, the operations the same as or similar to those explained with FIGS. 16A-19B are performed, thereby forming gate structures for multiple threshold voltage NC-FETs. As set forth above, the structure formed by the ferroelectric layer 120, the conductive liner layer 125 and the second conductive layer 130 are substantially the same for the N-uLVT FET, the N-SLV FET, the P-SLV FET and P-uLVT FET. In particular, as shown in FIGS. 26A-26D, the ferroelectric layer 120, the conductive liner layer 125 and the second conductive layer 130 have a "U-shape" in the Y directional cross section, and the ferroelectric layer 120, the conductive liner layer 125 and the second conductive layer 130 have a "U-shape" between the sidewall spacers 48, also in the X directional cross section. Further, the upper surface of the MIM structure is substantially flat, as shown in FIGS. 26A-26D.

Figure 26B:
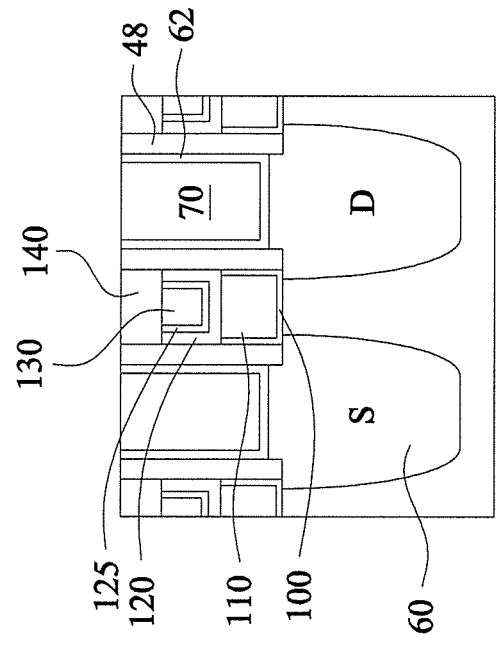
FIGS. 26A-26D show exemplary cross sectional views illustrating one of the various stages for manufacturing a semiconductor device according to various embodiment of the present disclosure.
Figure 26A:
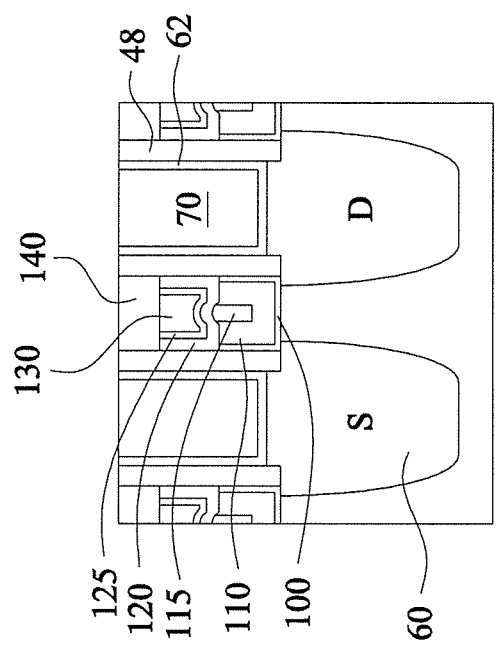
Figure 26C:
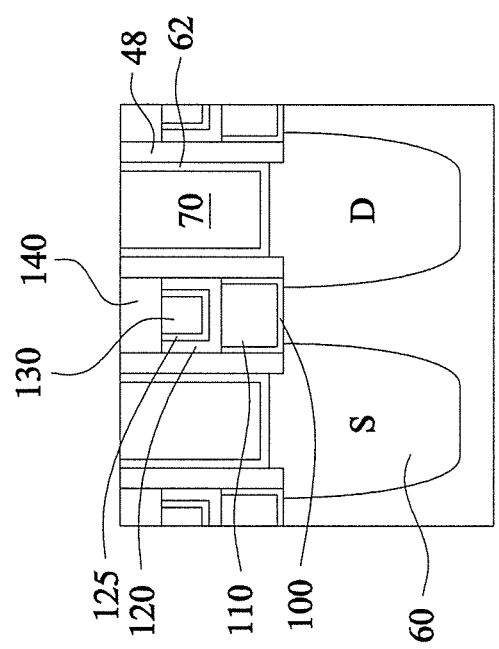
Figure 26D:
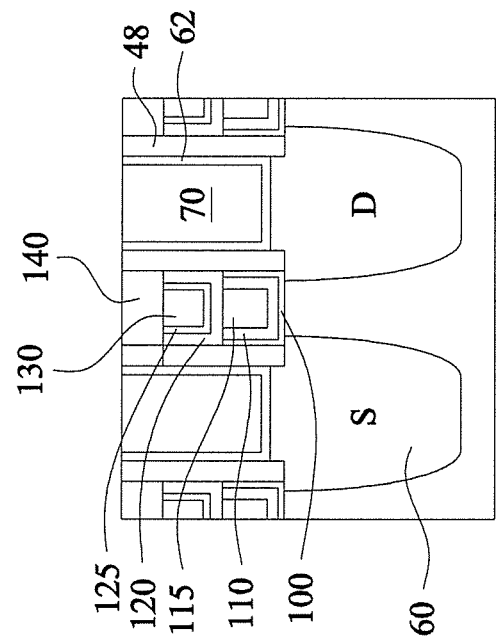
Figures 27A, 27B:
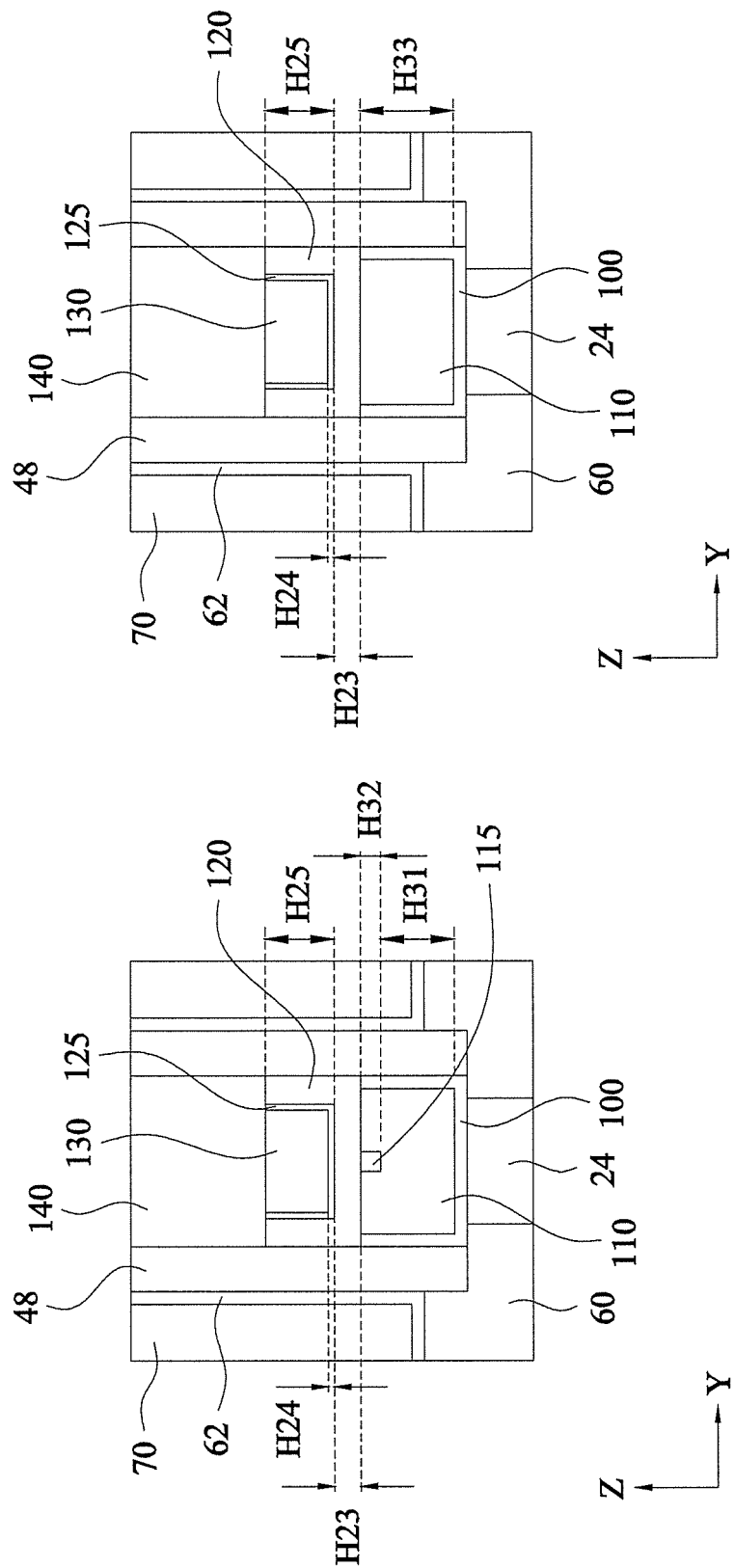
FIGS. 27A and 27B show exemplary cross sectional views illustrating gate structures of a semiconductor device according to various embodiment of the present disclosure.

FIG. 27A is an exemplary cross sectional view corresponding to FIG. 26A, and FIG. 27B is an exemplary cross sectional view corresponding to FIGS. 26B and 26C. FIG. 20B corresponds to FIG. 26D.

In FIG. 27A, the thickness H31 of the WFM layer 110 above the channel 24 between the gate dielectric layer and the bottom of the first conductive layer 115 is in a range from about 5 nm to about 20 nm in some embodiments. The thickness H32 of the first conductive layer 115 is in a range from about 0.5 nm to about 5 nm in some embodiments. In FIG. 27B, the thickness H33 of the WFM layer 110 above the channel 24 is in a range from about 5 nm to about 50 nm in some embodiments. Different FETs with different threshold voltages have different WFM layer thicknesses and thus the amount (volume) of the first conductive layer 115 (e.g., W, Co, Ni and/or Cu) varies, including zero.

In the foregoing embodiments, FinFETs are employed. However, the foregoing technologies may be applied to planar type FET or any other suitable transistors formed by the gate replacement technology.

It will be understood that not all advantages have been necessarily discussed herein, no particular advantage is required for all embodiments or examples, and other embodiments or examples may offer different advantages.

For example, in the present disclosure, an NC-FET is formed by utilizing a gate replacement technology. After the materials/layers for the lower MOS structure is formed in the gate space, the materials/layers for the lower MOS structure is recessed to make a space for the upper MIM structure. Accordingly, the ferroelectric material layer can be conformally formed in the space, regardless of the lower MOS structures for FETs with various threshold voltages. Further, the NC-FET can be formed with a regular FET with an additional one photolithography operation, and thus, an increase in cost can be minimized.

In accordance with an aspect of the present disclosure, a semiconductor device includes a first channel region disposed over a substrate, and a first gate structure disposed over the first channel region. The first gate structure includes a gate dielectric layer disposed over the channel region, a lower conductive gate layer disposed over the gate dielectric layer, a ferroelectric material layer disposed over the lower conductive gate layer, and an upper conductive gate layer disposed over the ferroelectric material layer. The ferroelectric material layer is in direct contact with the gate dielectric layer and the lower gate conductive layer, and has a U-shape cross section.

In accordance with another aspect of the present disclosure, a semiconductor device includes a first field effect transistor (FET) and a second FET. A gate structure of the first FET includes a first gate dielectric layer made of a dielectric material, a first conductive layer made of a first conductive material, a second conductive layer made of a second conductive material and a first gate cap insulating layer disposed on the second conductive layer. A gate structure of the second FET includes a second gate dielectric layer made of the dielectric material, a third conductive layer made of the first conductive material, a ferroelectric material layer disposed over the second gate dielectric layer and the third conductive layer, a fourth conductive layer disposed over the ferroelectric material layer, and a second gate cap insulating layer disposed on the fourth conductive layer.

In accordance with another aspect of the present disclosure, in a method of manufacturing a semiconductor device, a fin field effect transistor (FinFET) structure is formed. The FinFET structure has a fin structure including a channel region and a dummy gate structure disposed over the channel region. The dummy gate structure is removed, thereby forming a gate space. A gate dielectric layer is formed in the gate space over the channel region. A lower gate electrode layer is formed over the gate dielectric layer. The gate dielectric layer and the lower gate electrode layer are recessed, thereby forming a recessed gate space. A ferroelectric material layer is formed on the recessed gate dielectric layer and lower gate electrode layer in the recessed gate space. An upper gate electrode layer is formed on the ferroelectric material layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a first gate space for a first fin field effect transistor (FinFET) in a first region and a second gate space for a second FinFET in a second region; each constituted by a sidewall spacer, wherein a first channel region of a first fin structure protrudes from an isolation insulating layer in the first gate space and a second channel region of a second fin structure protrudes from an isolation insulating layer in the second gate space;
   forming a gate dielectric layer over the first channel region in the first gate space and over the second channel region in the second gate space;
   forming a first gate electrode layer over the gate dielectric layer in the first region and the second region;
   while protecting the second region for the second FinFET by a cover pattern, recessing the gate dielectric layer and the first gate electrode layer in the first region, thereby forming a recessed gate dielectric layer, a recessed first gate electrode layer and a recessed gate space above the recessed gate dielectric layer and the recessed first gate electrode layer in the first region for the first FinFET;

forming a layer of a ferroelectric material on the recessed gate dielectric layer and the recessed first gate electrode layer in the recessed gate space;

forming a layer of a conductive material on the layer of the ferroelectric material; and forming a second gate electrode layer on the layer of the ferroelectric material by performing a planarization process to remove an upper portion of the layer of the conductive material and an upper portion of the layer of the ferroelectric material in the first region.

2. The method of claim 1, wherein the forming the first gate electrode layer includes:

forming a first conductive layer over the gate dielectric layer; and forming a second conductive layer over the first conductive layer.

3. The method of claim 2, wherein the forming the second gate electrode layer includes:

forming a third conductive layer over the layer of the ferroelectric material; and forming a fourth conductive layer over the third conductive layer.

4. The method of claim 2, wherein the layer of the ferroelectric material is in direct contact with an uppermost portion of the recessed gate dielectric layer and the first conductive layer, and has a U-shape cross section.

5. The method of claim 4, wherein the U-shape has a horizontal portion and vertical portions vertically extending from ends of the horizontal portion in a direction away from the substrate.

6. The method of claim 2, wherein the second conductive layer does not have a U-shape cross section.

7. The method of claim 2, wherein:

the first conductive layer includes one or more layers of Ti, TiN, TiAl, TiAlC, TaN, TaAlC, Al, TiC, Co, Hifi, TiSi or TaSi.

8. The method of claim 2, wherein:

the forming the second gate electrode layer includes:
    forming a conductive liner layer on the layer of the ferroelectric material; and
    forming a body conductive layer over the conductive liner layer, and
the conductive liner layer has a U-shape cross section.

9. The method of claim 8, wherein the body conductive layer does not have a U-shape cross section.

10. The method of claim 8, wherein:

the conductive liner layer includes one or more layers of Ti, TiN, Ta or TaN.

11. The method of claim 1, wherein the layer of the ferroelectric material includes one or more layers of $Pb_3Ge_5O_{11}$ (PGO), lead zirconate titanate (PZT), $SrBi_2Ta_2O_9$ (SBT or SBTO), $SrB_4O_7$ (SBO), $Sr_aBi_bTa_cNb_dO_x$ (SBTN), $SrTiO_3$ (STO), $BaTiO_3$ (BTO), $(Bi_xLa_y)Ti_3O_{12}$ (BLT), $LaNiO_3$ (LNO), $YMnO_3$, $ZrO_2$, zirconium silicate, ZrAlSiO, $HfO_2$, $HfZrO_2$, hafnium silicate, HfAlO, LaAlO, lanthanum oxide, $HfO_2$ doped with Si ($HfSiO_x$), or $Ta_2O_5$.

12. A method of manufacturing a semiconductor device, comprising:

forming a first structure in a first region and a second structure in a second region over a substrate, each of the first structure and the second structure including a channel region and a dummy gate structure disposed over the channel region;

removing the dummy gate structure from the first and second structures, thereby forming a gate space in each of the first and second structures;

forming a gate dielectric layer over the first channel region in the first gate space and over the second channel region in the second gate space;

forming a first gate electrode layer over the gate dielectric layer in the first region and the second region;

while protecting the second region by a cover pattern, recessing the gate dielectric layer and the first gate electrode layer in the first region, thereby forming a recessed gate dielectric layer, a recessed first gate electrode layer and a recessed gate space above the recessed gate dielectric layer and the recessed first gate electrode layer in the first region;

forming a layer of a ferroelectric material on the recessed gate dielectric layer and the recessed first gate electrode layer in the recessed gate space;

forming a layer of a conductive material on the layer of the ferroelectric material; and forming a second gate electrode layer on the layer of the ferroelectric material by performing a planarization process to remove an upper portion of the layer of the conductive material and an upper portion of the layer of the ferroelectric material in the first region.

13. The method of claim 12, wherein:

after the gate dielectric layer and the first gate electrode layer are recessed in the first region, the cover pattern is removed.

14. The method of claim 13, wherein the layer of the ferroelectric material is also formed on the first gate electrode layer in the second region.

15. The method of claim 12, further comprising:

recessing the second gate electrode layer and the layer of the ferroelectric material to form a space in the first region; and forming a cap insulating layer over by filling the space with an insulating material.

16. The method of claim 15, further comprising:

exposing the first gate electrode layer by the planarization process, thereby forming the exposed first gate electrode layer;

recessing the exposed first gate electrode layer to form a space in the second region; and forming a cap insulating layer over by filling the space with an insulating material.

17. A method of manufacturing a semiconductor device, comprising:

forming a first gate space for a first field effect transistor (FET) in a first region and a second gate space for a second FET in a second region, each constituted by a sidewall spacer, wherein a first channel region of each of a plurality of first fin structures protrudes from an isolation insulating layer in the first gate space and a second channel region of each of a plurality of second fin structures protrudes from an isolation insulating layer in the second gate space;

forming a gate dielectric layer over the first channel region in the first gate space and over the second channel region in the second gate space;

forming a first gate electrode layer over the gate dielectric layer in the first region and the second region;

while protecting the second region for the second FET by a cover pattern, recessing the gate dielectric layer and the first gate electrode layer in the first region; thereby forming a recessed gate dielectric layer, a recessed first gate electrode layer and a recessed gate space above the recessed gate dielectric layer and the recessed first gate electrode layer in the first region for the first FET;

forming a layer of a ferroelectric material on the recessed gate dielectric layer and the recessed first gate electrode layer in the recessed gate space;

forming a layer of a conductive material on the layer of the ferroelectric material; and forming a second gate electrode layer on the layer of the ferroelectric material by performing a planarization process to remove an upper portion of the layer of the conductive material and an upper portion of the layer of the ferroelectric material in the first region.

18. The method of claim 17, wherein the planarization process is a chemical mechanical polishing process and the planarization process also exposes the first gate electrode layer in the second region.

19. The method of claim 17, wherein
the forming the first gate electrode layer includes:
   forming a first conductive layer over the gate dielectric layer; and
   forming a second conductive layer disposed over the first conductive layer, and
the second conductive layer is one or more layers of W, Co, Ni or Cu.

20. The method of claim 19, wherein
the forming the second gate electrode layer includes:
   forming a conductive liner layer on the layer of the ferroelectric material; and
   forming a body conductive layer over the conductive liner layer, and
the body conductive layer includes one or more layers of W, Co, Ni or Cu.

* * * * *